US012635092B2

(12) United States Patent
Kim et al.

(10) Patent No.: US 12,635,092 B2
(45) Date of Patent: May 19, 2026

(54) DISPLAY DEVICE WITH STANDS

(71) Applicant: LG ELECTRONICS INC., Seoul (KR)

(72) Inventors: Taewook Kim, Seoul (KR); Dongkyoon Han, Seoul (KR); Yoonsu Kim, Seoul (KR); Hyeonwoo Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 238 days.

(21) Appl. No.: 18/319,353

(22) Filed: May 17, 2023

(65) Prior Publication Data

US 2023/0389206 A1 Nov. 30, 2023

(30) Foreign Application Priority Data

May 25, 2022 (KR) ........................ 10-2022-0064072

(51) Int. Cl.
| | |
|---|---|
| *H05K 5/02* | (2006.01) |
| *F16M 11/04* | (2006.01) |
| *F16M 11/22* | (2006.01) |

(52) U.S. Cl.
CPC ........... *H05K 5/0234* (2013.01); *F16M 11/04* (2013.01); *F16M 11/22* (2013.01)

(58) Field of Classification Search
None
See application file for complete search history.

(56) References Cited

U.S. PATENT DOCUMENTS

| | | | |
|---|---|---|---|
| 2016/0178114 A1 | 6/2016 | Hoyle | |
| 2017/0146182 A1* | 5/2017 | Fang | F16M 11/22 |
| 2018/0027671 A1* | 1/2018 | Kang | H05K 5/0217 361/707 |
| 2022/0065390 A1* | 3/2022 | You | F16M 11/22 |

FOREIGN PATENT DOCUMENTS

| | | | |
|---|---|---|---|
| CN | 208861609 | | 5/2019 |
| CN | 208861609 U | * | 5/2019 |
| EP | 2719937 | | 10/2015 |
| JP | 2021124720 | | 8/2021 |

(Continued)

OTHER PUBLICATIONS

Zhang CN 208861609 U M (Year: 2019) machine translation.*

(Continued)

*Primary Examiner* — Allen L Parker
*Assistant Examiner* — Elisa Sasserath
(74) *Attorney, Agent, or Firm* — LEE, HONG, DEGERMAN, KANG & WAIMEY

(57) ABSTRACT

Disclosed is a display device. The display device of the present disclosure may include: a head having a display panel; and a stand for supporting a lower side of the head, wherein the stand may include: a neck which is coupled on a rear side of the head, and a part of which is located below the lower side of the head; a leg which faces the head with respect to the part of the neck, and extends downward from the head; and a reinforcing plate coupled to the leg, wherein the reinforcing plate includes: a first part coupled to the leg; and a second part which is bent toward the part of the neck from the first part, and coupled to a lower surface of the part of the neck.

13 Claims, 27 Drawing Sheets

(56)　　　　　References Cited

FOREIGN PATENT DOCUMENTS

JP　　　　2021124720　A　*　8/2021
KR　　10-2017-0105919　　　9/2017

OTHER PUBLICATIONS

Zhang et. al (CN 208861609 U) (Year: 2019).*
Yamada (JP-2021124720-A) (Year: 2021).*
Zhang (CN 208861609 U) (Year: 2019).*
PCT International Application No. PCT/KR2023/006106, International Search Report dated Aug. 30, 2023, 4 pages.
Korean Intellectual Property Office Application No. 10-2022-0064072, Office Action dated Mar. 8, 2024, 5 pages.
European Patent Office Application Serial No. 23812032.3, Search Report dated Jul. 8, 2025, 8 pages.

* cited by examiner

FIG. 12

DISPLAY DEVICE WITH STANDS

CROSS-REFERENCE TO THE RELATED APPLICATION

Pursuant to 35 U.S.C. § 119(a), this application claims the benefit of earlier filing date and right of priority to Korean Patent Application No. 10-2022-0064072, filed on May 25, 2022, the contents of which are hereby incorporated by reference herein in its entirety.

BACKGROUND OF THE INVENTION

1. Field of the Invention

The present disclosure relates to a display device.

2. Description of the Related Art

As the information society has developed, the demand for display device is increasing in various forms, and accordingly, in recent years, various display devices such as a liquid crystal display (LCD), plasma display panel (PDP), electroluminescent display (ELD), vacuum fluorescent display (VFD), Organic Light Emitting Diode (OLED), and the like have been studied and used.

Among them, an LCD panel includes a TFT substrate and a color substrate that face each other with a liquid crystal layer interposed therebetween, and can display an image by using light provided from a backlight unit. In addition, the OLED panel can display an image by depositing an organic material layer capable of emitting light by itself on a substrate on which a transparent electrode is formed.

Recently, a lot of research has been done on a structure for reinforcing the rigidity of a stand supporting a display device.

SUMMARY OF THE INVENTION

It is an object of the present disclosure to solve the above and other problems.

Another object of the present disclosure may be to provide a display device having a basket capable of accommodating peripheral devices in a rearward of a back cover.

Another object of the present disclosure may be to provide a display device having a bracket capable of mounting a device such as a multi-tap.

Another object of the present disclosure may be to provide a coupling structure between a back cover and a basket, and a coupling structure between the basket and a bracket.

Another object of the present disclosure may be to provide a back cover in which a groove in which a cable is located is formed on a rear side.

Another object of the present disclosure may be to provide a path of cable between a groove of back cover and a device provided in a basket or bracket.

Another object of the present disclosure may be to provide a display device provided with a stand which separates a display panel from a ground and has a cable groove in which a cable is located.

Another object of the present disclosure may be to provide a display device provided with a stand having reinforced rigidity to prevent a display device from rapidly being reversed, when an external impact acts on the display device.

In accordance with an aspect of the present disclosure, a display device may include: a head having a display panel; and a stand for supporting a lower side of the head, wherein the stand may include: a neck which is coupled on a rear side of the head, and a part of which is located below the lower side of the head; a leg which is opposite the head with respect to the part of the neck, and which extends downward from the head; and a reinforcing plate coupled to the leg, wherein the reinforcing plate may include: a first part coupled to the leg; and a second part which is bent toward the part of the neck from the first part, and which is coupled to a lower surface of the part of the neck.

BRIEF DESCRIPTION OF THE DRAWINGS

The above and other objects, features and advantages of the present invention will be more apparent from the following detailed description in conjunction with the accompanying drawings, in which:

FIGS. 1 to 27 are diagrams illustrating examples of a display device according to embodiments of the present disclosure.

DETAILED DESCRIPTION OF THE PREFERRED EMBODIMENTS

Figure 1:
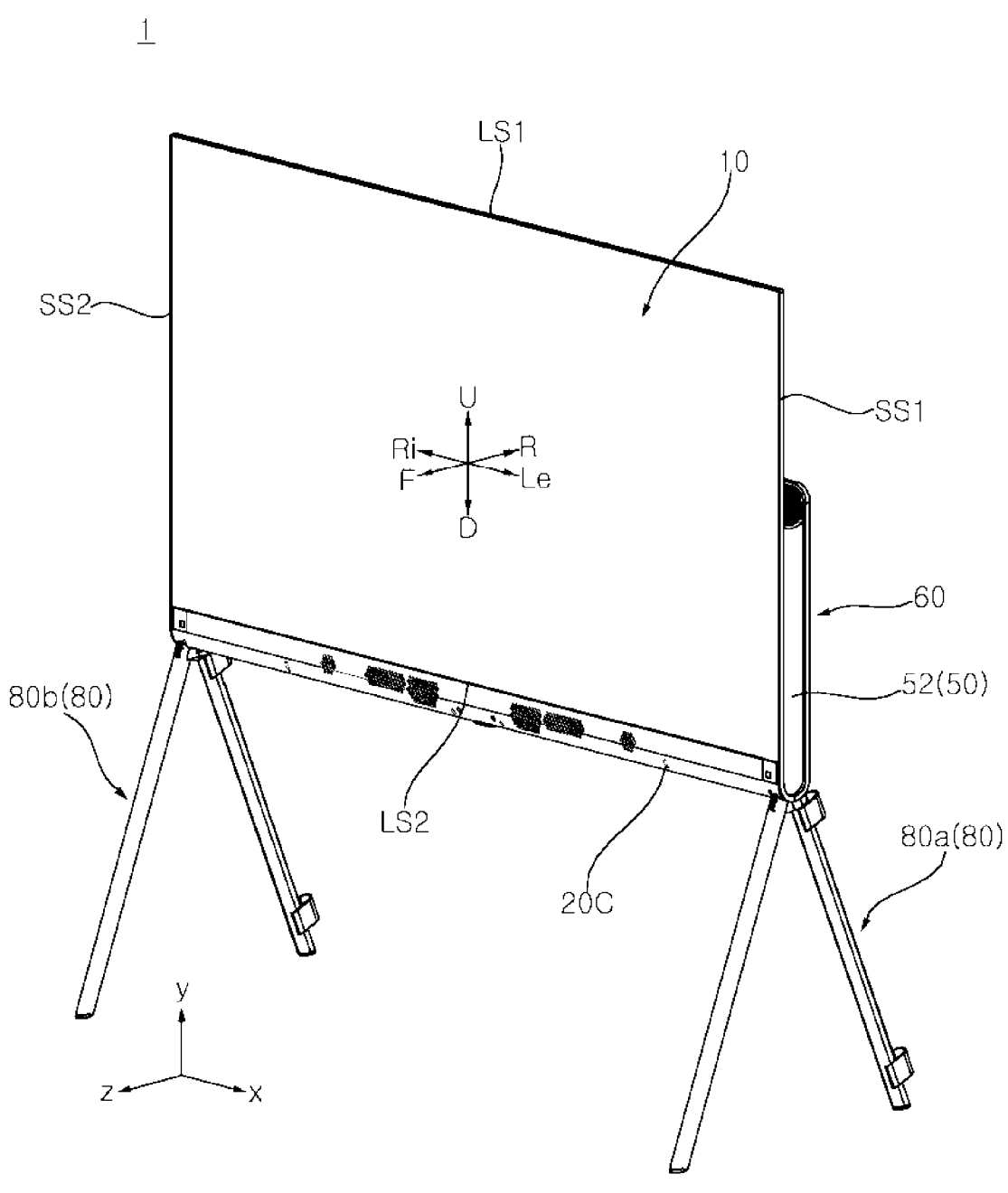

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the present application, it should be understood that the terms "comprises, includes," "has," etc. specify the presence of features, numbers, steps, operations, elements, components, or combinations thereof described in the specification, but do not preclude the presence or addition of one or more other features, numbers, steps, operations, elements, components, or combinations thereof.

The direction indications of up (U), down (D), left (Le), right (Ri), front (F), and rear (R) shown in the drawings are just only for convenience of explanation, and thus, the technical concept disclosed in the present specification is not limited thereto.

Referring to FIG. 1, a display device 1 may include a display panel 10. The display panel 10 may display an image.

The display panel 10 may include a first long side LS1, a second long side LS2 opposite to the first long side LS1, a first short side SS1 adjacent to the first long side LS1 and the second long side LS2, and a second short side SS2 opposite to the first short side SS1. Meanwhile, for convenience of explanation, although the lengths of the first and second long sides LS1 and LS2 are illustrated and described as being longer than the lengths of the first and second short sides SS1 and SS2, a case in which the lengths of the first and second long sides LS1 and LS2 are approximately equal to the lengths of the first and second short sides SS1 and SS2 may also be possible.

A direction parallel to the short side SS1, SS2 of the display panel 10 may be referred to as an up-down direction. A direction parallel to the long side LS1, LS2 of the display panel 10 may be referred to as a left-right direction. A direction perpendicular to the long side LS1, LS2 and the short side SS1, SS2 of the display panel 10 may be referred to as a front-rear direction.

A direction in which the display panel 10 displays an image may be referred to as a forward (F, z), and a direction opposite to this may be referred to as a rearward (R).

The side of the first short side SS1 may be referred to as a left (Le, x). The side of the second short side SS2 may be referred to as a right Ri. The side of the first long side LS1 may be referred to as an upward side (U, y). The side of the second long side LS2 may be referred to as a downward side D.

Hereinafter, a display panel using an organic light emitting diode (OLED) will be described as an example, but the display panel applicable to the present disclosure is not limited thereto.

Figure 2:
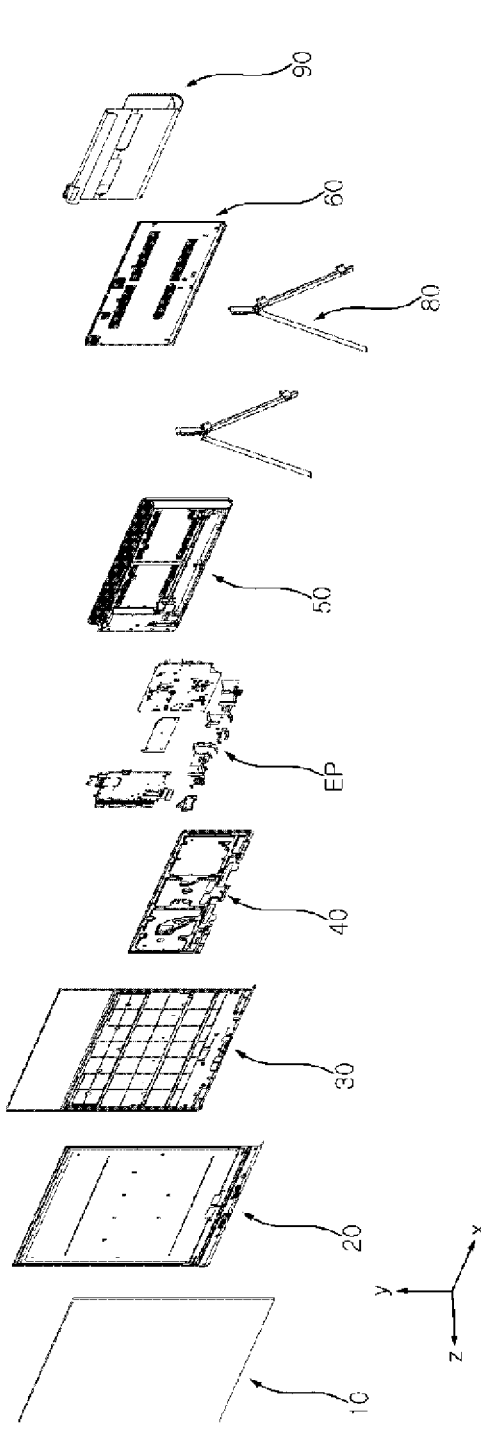

Referring to FIGS. 1 and 2, the display device 1 may include a display panel 10, a plate 20, a frame 30, a mount plate 40, an electronic component EP, a back cover 50, an end cover 60, a stand 80, and a basket 90.

A portion of the display device 1 including the display panel 10 may be referred to as a head. For example, the head may include a display panel 10, a plate 20, a frame 30, a mount plate 40, an electronic component EP, a back cover 50, and an end cover 60.

The head may include a first long side, a second long side, a first short side, and a second short side corresponding to the display panel 10. The side of the first long side of the head may be referred to as an upper side of the head. The side of the second long side of the head may be referred to as a lower side of the head. The side of the first short side of the head may be referred to as a left side of the head. The side of the second short side of the head may be referred to as a right side of the head. The front side of the head may refer to the forward-most side in which the display panel 10 is located. The rear side of the head may mean the rearmost side in the opposite side of the display panel 10. For example, the rear side of the head may refer to the rear side of the end cover 60. As another example, the rear side of the head may refer to the rear side of the back cover 50.

The display panel 10 may divide an image into a plurality of pixels and output an image by matching color, brightness, and saturation for each pixel. The display panel 10 may be divided into an active area in which an image is displayed and a de-active area in which an image is not displayed. The display panel 10 may generate light corresponding to a color of red, green, or blue according to a control signal.

The plate 20 may be located in a rearward of the display panel 10, and the display panel 10 may be coupled thereto. The plate 20 may include a metal material. For example, it may be a hot dipped galvanized iron (GI) or an electrolytic galvanized iron (EGI). The plate 20 may be referred to as an inner plate.

The frame 30 may be located in a rearward of the plate 20, and may be coupled to the plate 20. The frame 30 may be an injection molding product. For example, the frame 30 may include a plastic material. The frame 30 may be referred to as a main frame, a module cover, or a cover bottom.

The mount plate 40 may be located in a rearward of the frame 30, and may be coupled to the frame 30. The mount plate 40 may include a metal material. The mount plate 40 may be referred to as a fixed plate or a PCB plate. The electronic component EP may be located in a rearward of the mount plate 40, and may be mounted on the mount plate 40.

The back cover 50 may be located in a rearward of the mount plate 40 and the electronic component EP, and may be coupled to the mount plate 40. The back cover 50 may cover the rearward of the mount plate 40 and the electronic component EP. The back cover 50 may be an injection molding product. For example, the back cover 50 may include a plastic material.

The end cover 60 may be located in a rearward of the back cover 50, and may be coupled to the back cover 50. The rear side of the back cover 50 may be covered by the end cover 60. The end cover 60 may be an injection molding product. For example, the end cover 60 may include a plastic material.

The stand 80 may support the head. The stand 80 may support the lower side of the head. The stand 80 may support the rear side of the head. The stand 80 may separates the head to the upward side from the ground. The stand 80 may be located between the back cover 50 and the end cover 60, and may be coupled to the back cover 50. The back cover 50 may be separated to the upward side from the ground by the stand 80.

The basket 90 may be located in a rearward of the end cover 60, and may span the upper end of the end cover 60.

Figure 3:
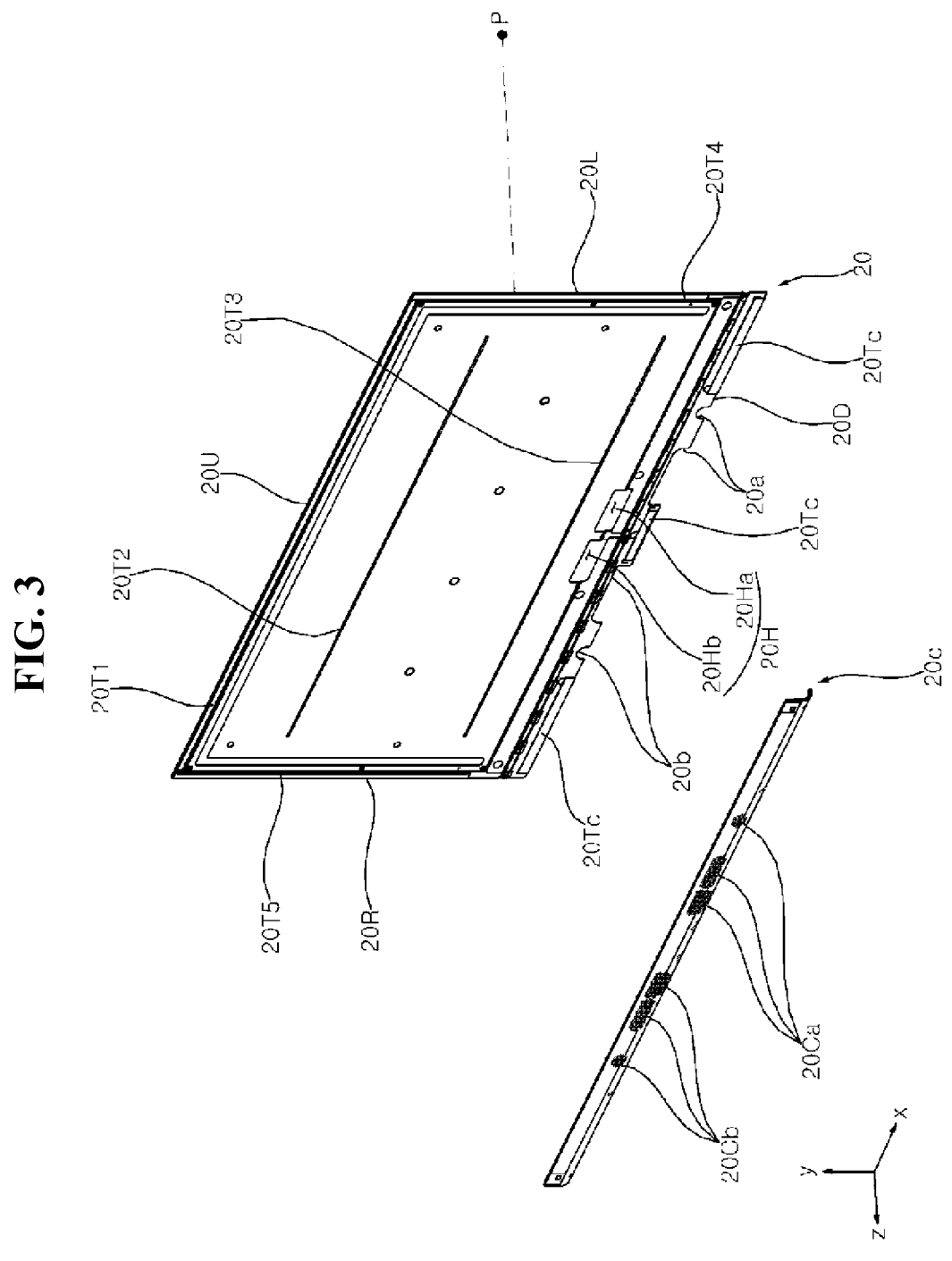
Figure 4:
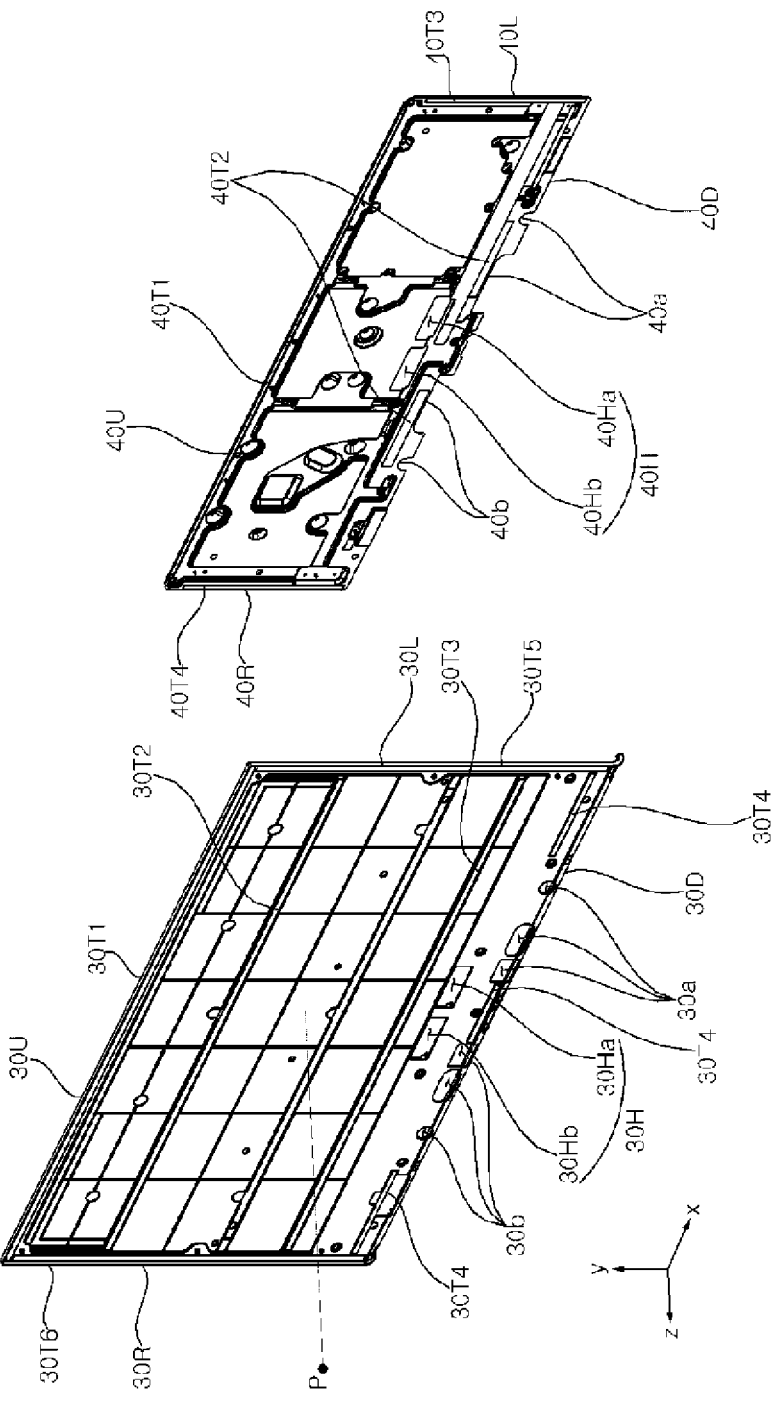

Referring to FIGS. 3 and 4, the size of the frame 30 may correspond to the size of the plate 20. The size of the frame 30 may be larger than the size of the plate 20, and the edges 30U, 30D, 30L, and 30R of the frame 30 may be located outside the edges 20U, 20D, 20L, and 20R of the plate 20. The size of the mount plate 40 may be smaller than the size of the frame 30. Alternatively, the size of the mount plate 40 may correspond to the size of the frame 30.

A first cable hole 20H may be adjacent to the lower side 20D of the plate 20, and may be formed to penetrate the plate 20 in the front-rear direction. The first cable hole 20H may include a first left cable hole 20Ha and a first right cable hole 20Hb that are spaced apart from each other along the lower side 20D.

A first speaker hole 20a, 20b may be formed from the lower side 20D of the plate 20 toward the inner side of the plate 20. The first speaker hole 20a, 20b may be formed by cutting out a part of the lower side 20D of the plate 20. The first speaker hole 20a, 20b may include a first left speaker hole 20a and a first right speaker hole 20b that are spaced apart from each other along the lower side 20D.

A second cable hole 30H may be adjacent to the lower side 30D of the frame 30, and may be formed to penetrate the frame 30 in the front-rear direction. The second cable hole 30H may include a second left cable hole 30Ha and a second right cable hole 30Hb that are spaced apart from each other along the lower side 30D.

A second speaker hole 30a, 30b may be located between the lower side 30D of the frame 30 and the second cable hole 30H, and may be formed to penetrate the frame 30 in the front-rear direction. The second speaker hole 30a, 30b may include a second left speaker hole 30a and a second right speaker hole 30b that are spaced apart from each other along the lower side 30D.

A third cable hole 40H may be adjacent to the lower side 40D of the mount plate 40, and may be formed to penetrate the mount plate 40 in the front-rear direction. The third cable hole 40H may include a third left cable hole 40Ha and a third right cable hole that are spaced apart from each other along the lower side 40D.

A third speaker hole 40a, 40b may be formed from the lower side 40D of the mount plate 40 toward the inner side of the mount plate 40. The third speaker hole 40a, 40b may be formed by cutting out a part of the lower side 40D of the mount plate 40. The third speaker hole 40a, 40b may include a third left speaker hole 40a and a third right speaker hole 40b that are spaced apart from each other along the lower side 40D.

In the front-rear direction, the first cable hole 20H may be aligned with the second cable hole 30H and the third cable hole 40H. In the front-rear direction, the first speaker hole 20a, 20b may be aligned with the second speaker hole 30a, 30b and the third speaker hole 40a, 40b.

Meanwhile, a front cover 20C may be adjacent to the lower side 20D of the plate 20, and may extend along the lower side 20D. The front cover 20C may opposite the frame 30 with respect to the plate 20. A fourth speaker hole 20Ca, 20Cb may be formed in the front cover 20C. In the front-rear direction, the fourth speaker hole 20Ca, 20Cb may be aligned with the first speaker hole 20a, 20b. For example, the front cover 20C may include a plastic material. In addition, the front cover 20C may include a fabric material.

Figure 5:
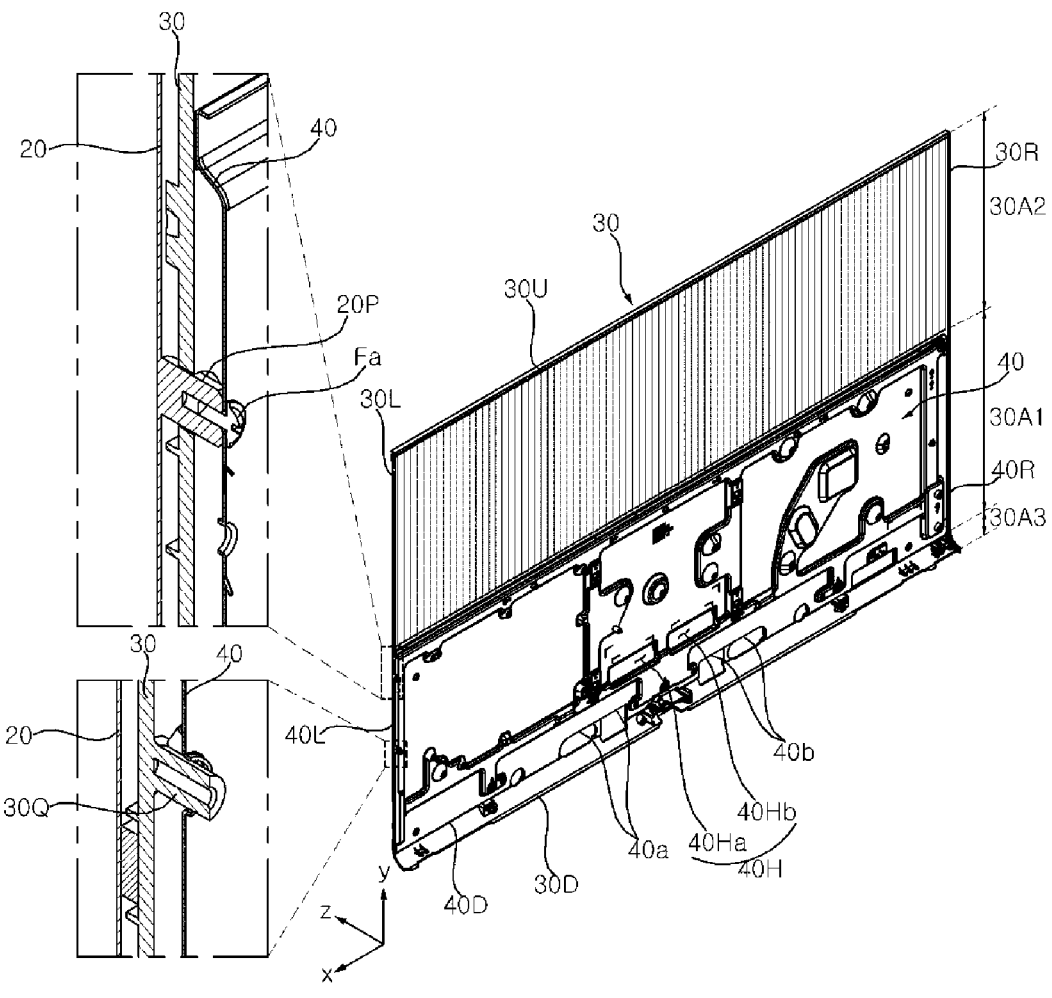
Figure 6:
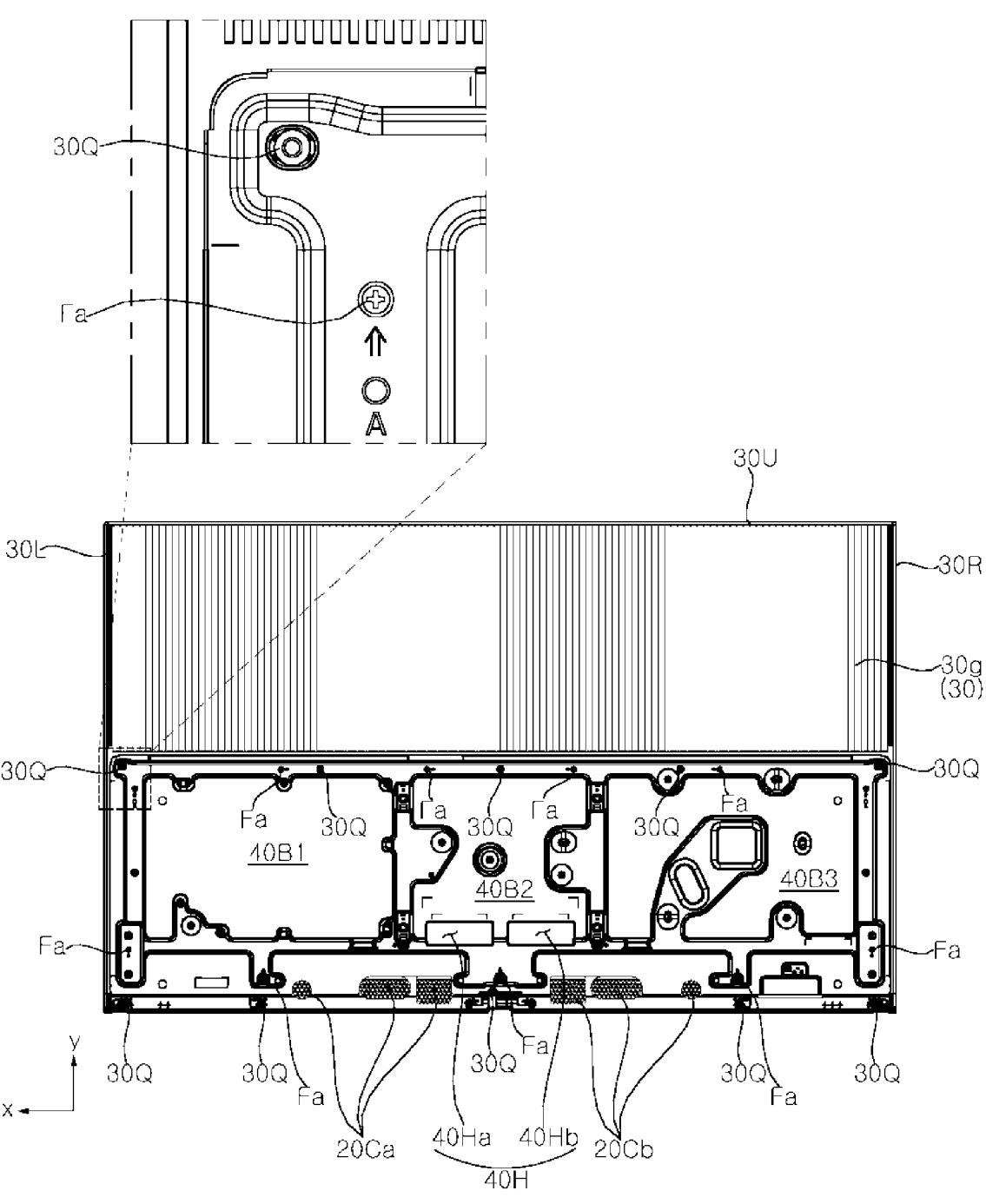

Referring to FIGS. 5 and 6, the frame 30 is coupled to or attached to the rear side of the plate 20 through a plurality of adhesive members (30T1, 30T2, 30T3, 30T4, 30T5, 30T6, refer to FIG. 4). For example, the plurality of adhesive members 30T1, 30T2, 30T3, 30T5, and 30T6 may be a double-sided tape.

The frame 30 may include a first part 30A1, a second part 30A2, and a third part 30A3. The first part 30A1 and the second part 30A2 may be collectively referred to as a flat portion, and the third part 30A3 may be referred to as a curved portion.

The first part 30A1 may be formed to be flat as a whole, and may include a second cable hole 30H (refer to FIG. 4).

The second part 30A2 may be a portion of the frame 30 located in the upward side of the first part 30A1. In the vertical direction, the length of the second part 30A2 may be the same as or similar to the length of the first part 30A1. A pattern 30g may be formed on the rear side of the second part 30A2. For example, the pattern 30g may be embossed vertical stripes.

The third part 30A3 may be a portion of the frame 30 located in the downward side of the first part 30A1. For example, the third part 30A3 may be curved in a rearward direction from the lower end of the first part 30A1. In the vertical direction, the length of the third part 30A3 may be smaller than the length of the first part 30A1. The lower side 20D (refer to FIG. 3) of the plate 20 may be located in or above a boundary between the first part 30A1 and the third part 30A3.

The mount plate 40 may be located in a rearward of the first part 30A1 of the frame 30. The size of the mount plate 40 may correspond to the size of the first part 30A1. That is, the second part 30A2 of the frame 30 may not be covered by the mount plate 40.

A fixing portion 20P may protrude to a rearward from the rear side of the plate 20, and may penetrate the first part 30A1 of the frame 30. The plurality of fixing portions 20P may be spaced apart from each other. For example, the plurality of fixing portions 20P may be disposed along the circumference of the first part 30A1. The fixing portion 20P may be aligned with a hole (no reference numeral) formed in the mount plate 40. A fastening member Fa, such as a screw, may be fastened to the fixing portion 20P through the hole of the mount plate 40. The plurality of fastening members Fa may be fastened to the plurality of fixing portions 20P. That is, the mount plate 40 may be coupled to the plate 20. Accordingly, the frame 30 may be coupled to the plate 20 and the mount plate 40 at between the plate 20 and the mount plate 40.

A coupling portion 30Q may protrude to the rearward from the rear side of the first part 30A1 and the rear side of the third part 30A3, and may be spaced apart from the fixing portion 20P. The plurality of coupling portions 30Q may be spaced apart from each other. For example, the plurality of coupling portions 30Q may be disposed along circumferences of the first part 30A1 and the third part 30A3. The coupling portion 30Q may penetrate the mount plate 40. A plurality of holes (no reference numeral) may be formed in the mount plate 40, and a plurality of coupling portions 30Q may pass therethrough.

Figure 7:
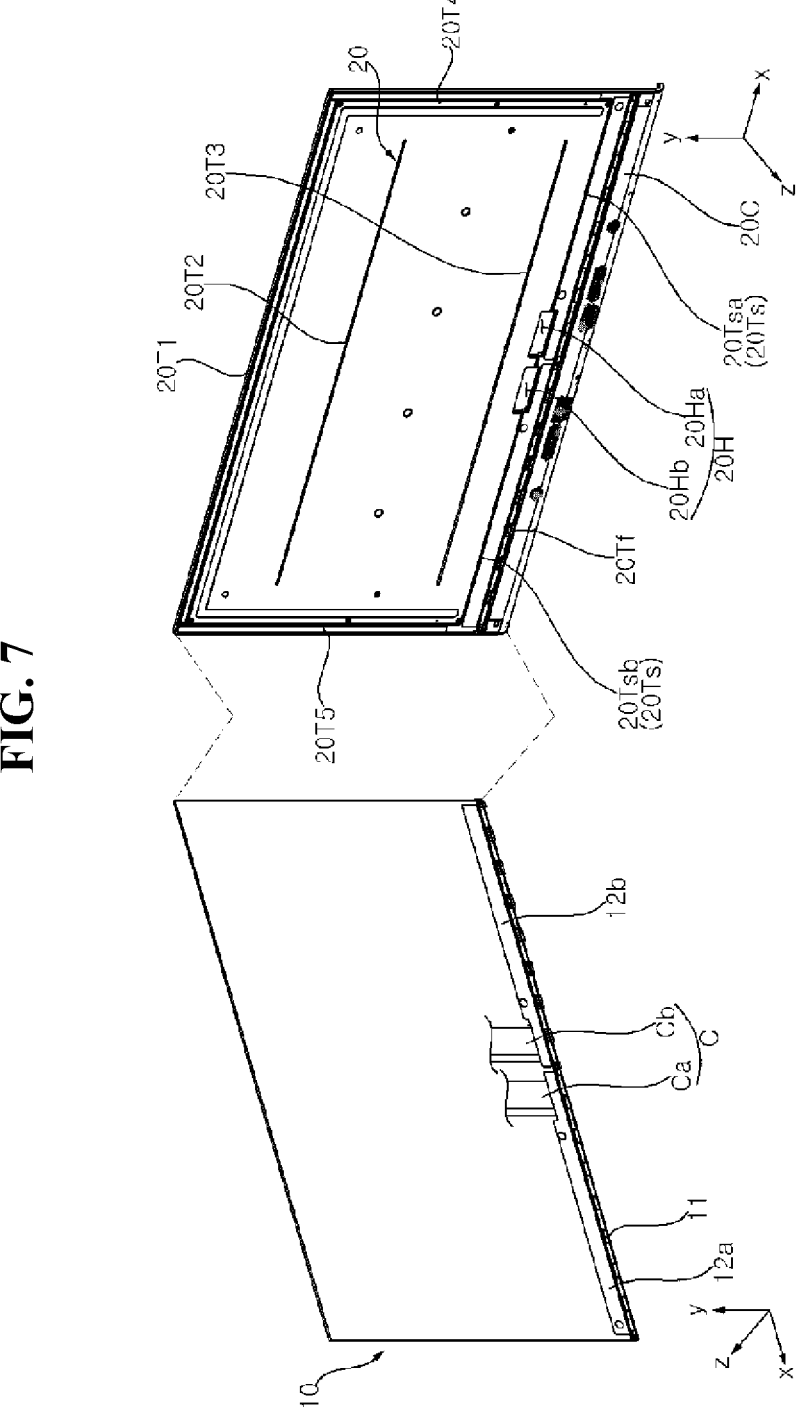

Referring to FIG. 7, the display panel 10 may be located in the forward of the plate 20. The plurality of adhesive members 20T1, 20T2, 20T3, 20T4, and 20T5 may be located between the display panel 10 and the plate 20, and may be coupled or attached to the rear side of the display panel 10 and the front surface of the plate 20. For example, the plurality of adhesive members 20T1, 20T2, 20T3, 20T4, and 20T5 may be a double-sided tape. Accordingly, the display panel 10 may be coupled to the plate 20. In this case, the display panel 10 may be disposed parallel with the plate 20.

A lower adhesive member 20Tf may be located above the front cover 20C, and may be coupled or attached to the front surface of the plate 20. The plurality of lower adhesive members 20Tf may be spaced apart from each other along the front cover 20C. The lower adhesive member 20Tf may be referred to as a cable adhesive member.

An upper adhesive member 20Ts may be located between the lower adhesive member 20Tf and the first cable hole 20H, and may be coupled or attached to the front surface of the plate 20. A first upper adhesive member 20Tsa may extend from a portion of the plate 20 adjacent to the first left cable hole 20Ha toward the left side of the plate 20. A second upper adhesive member 20Tsb may extend from a portion of the plate 20 adjacent to the first right cable hole 20Hb toward the right side of the plate 20. The upper adhesive member 20Ts may be referred to as a substrate adhesive member.

A source PCB 12a, 12b may be adjacent to the lower side of the display panel 10, and may extend along the lower side of the display panel 10. In the front-rear direction, a first source PCB 12a may be aligned with the first upper adhesive member 20Tsa, and a second source PCB 12b may be aligned with the second upper adhesive member 20Tsb.

A source chip on film (COF) 11 may be located between the lower side of the display panel 10 and the source PCBs 12a, 12b, and may be electrically connected to the display panel 10 and the source PCBs 12*a*, 12*b*. In the front-rear direction, the plurality of source COFs 11 may be aligned with the plurality of lower adhesive members 20Tf.

A cable C such as a flexible flat cable (FFC) may be electrically connected to the source PCB 12*a*, 12*b*. A first cable Ca may be electrically connected to the first source PCB 12*a*, and may extend to the rearward of the frame 30 by penetrating the first left cable hole 20Ha. A second cable Cb may be electrically connected to the second source PCB 12*b*, and may extend to the rearward of the frame 30 by penetrating the first right cable hole 20Hb.

The lower adhesive member 20Tf may be located between the source COF 11 and the plate 20, and may be coupled or attached to the source COF 11 and the plate 20. The upper adhesive member 20Tsa, 20Tsb may be located between the source PCB 12*a*, 12*b* and the plate 20, and may be coupled or attached to the source PCB 12*a*, 12*b* and the plate 20. For example, the lower adhesive member 20Tf and the upper adhesive member 20Tsa, may be a double-sided tape. Accordingly, the source COF 11 and the source PCB 12*a*, 12*b* may be coupled to the plate 20.

Figure 8:
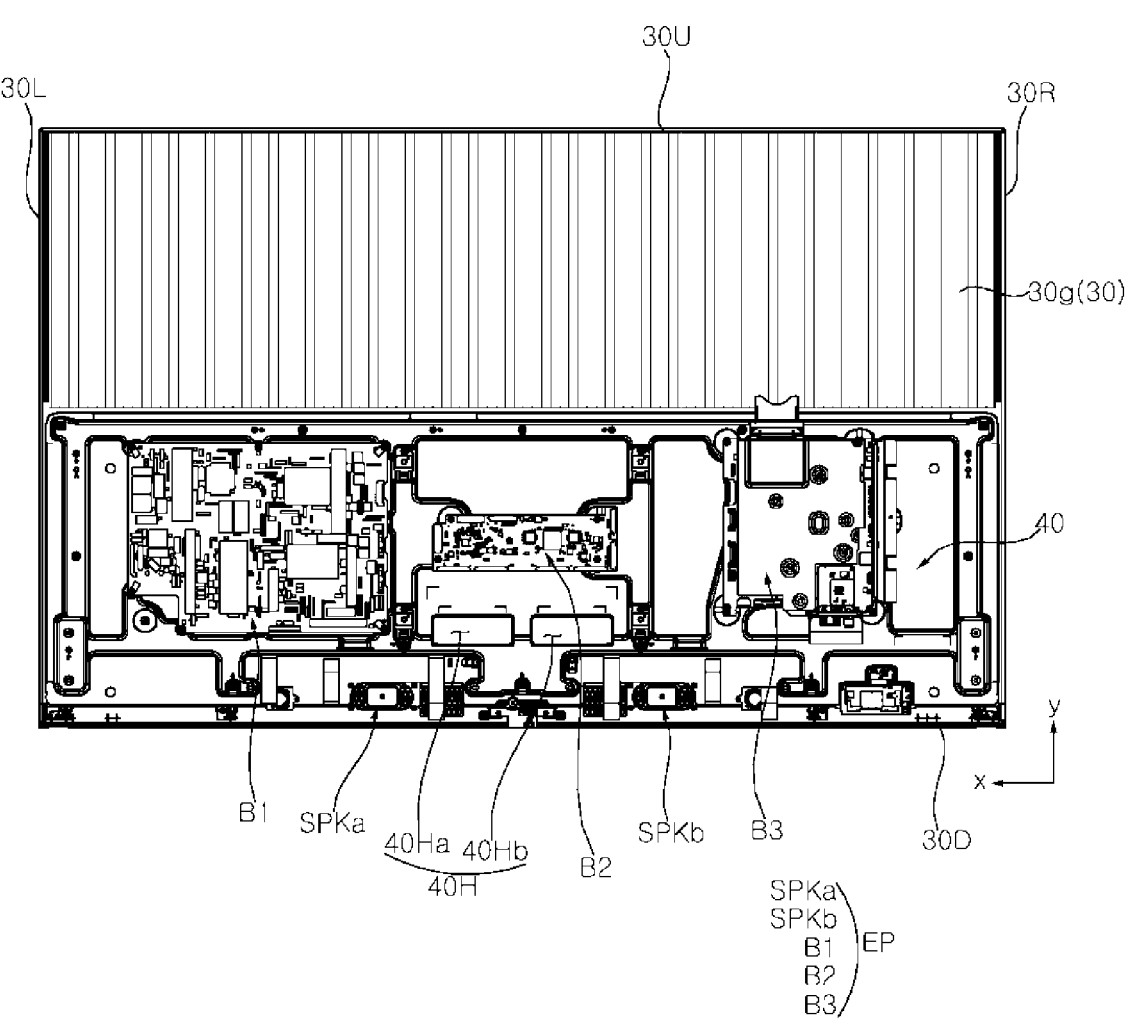

Referring to FIG. 8, the mount plate 40 may include a flat plate portion and a press portion formed while being pressed from the flat plate portion. Accordingly, the rigidity of the mount plate 40 may be improved.

The electronic component EP may be located in the rearward of the mount plate 40, and may be mounted on the mount plate 40. The electronic component EP may include a plurality of boards B1, B2, and B3 and a speaker SPKa, SPKb.

A power supply board B1 may be located in the rearward of the mount plate 40, and may be coupled to the mount plate 40 through a screw fastening method or the like. The power supply board B1 may be located in the left of the central area of the mount plate 40 (refer to 40B1 in FIG. 6). The power supply board B1 may provide power to each component of the display device.

A timing controller board B2 may be located in the rearward of the mount plate 40, and may be coupled to the mount plate 40 through a screw fastening method or the like. The timing controller board B2 may be located in the central area of the mount plate 40 (refer to 40B2 of FIG. 6), and may be located above the third cable hole 40H. The timing controller board B2 may be electrically connected to a cable C (refer to FIG. 11) and may provide an image signal to the display panel 10.

A main board B3 may be located in the rearward of the mount plate 40, and may be coupled to the mount plate 40 through a screw fastening method or the like. The main board B3 may be located in the right of the central area of the mount plate 40 (refer to 40B3 of FIG. 6). The main board B3 may control the display device.

The speaker SPKa, SPKb may be located in the rearward of the mount plate 40, and may be coupled to the mount plate 40 through a screw fastening method or the like. The speaker SPKa, SPKb may be adjacent to the lower side of the mount plate 40. The left speaker SPKa may be aligned with the left speaker holes (40*a*, 30*a*, 20*a*, 20Ca, refer to FIGS. 3 and 4), and the right speaker SPKb may be aligned with the right speaker hole (40*b*, 30*b*, 20*b*, 20Cb, refer to FIGS. 3 and 4). Accordingly, the speaker SPKa, SPKb may provide sound in the forward of the display device through the speaker hole (40*a*, 30*a*, 20Ca, 40*b*, 30*b*, 20*b*, 20Cb).

Figure 9:
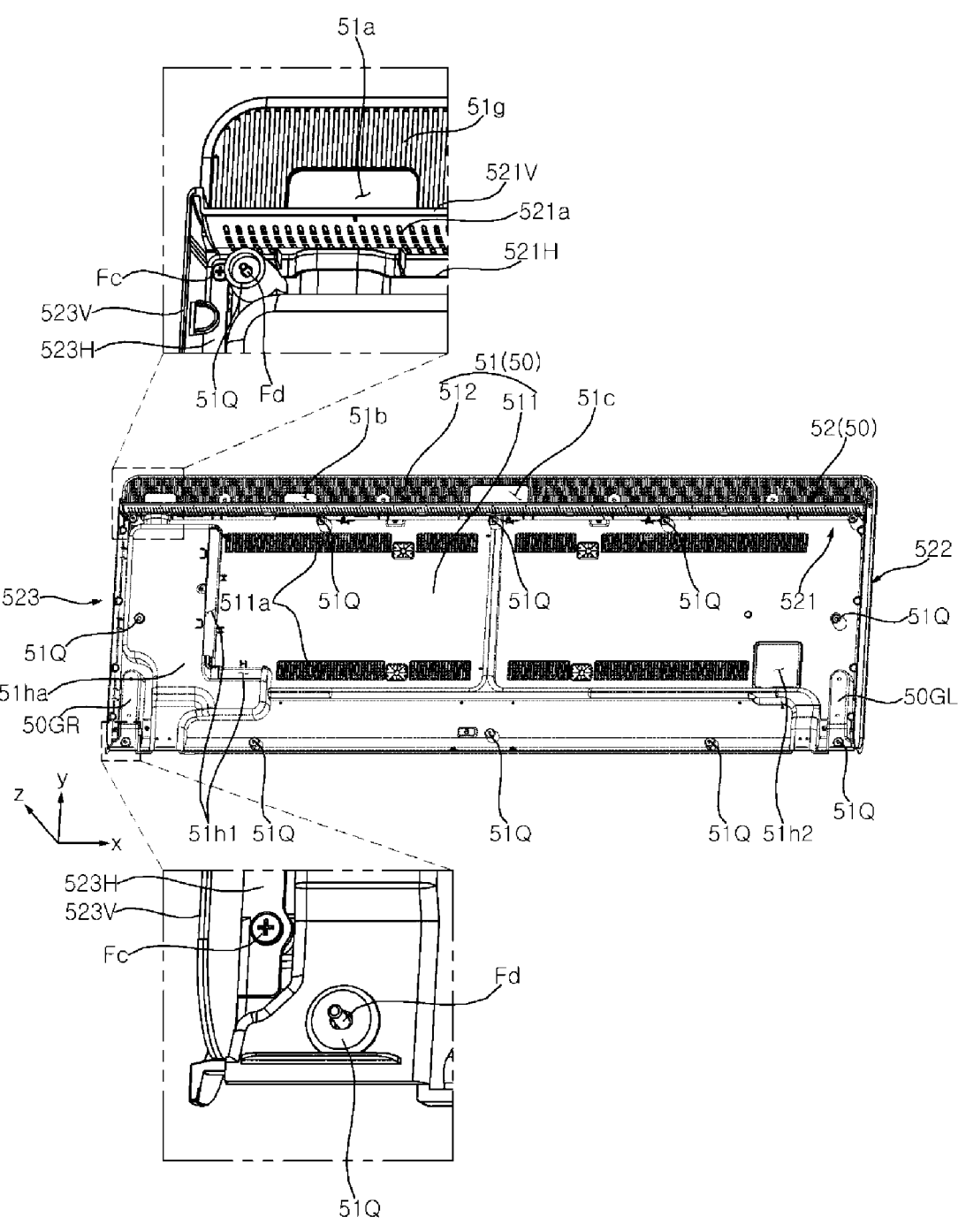

Referring to FIG. 9, the side cover 52 may have a square bracket shape as a whole. The side cover 52 may include a top part 521, a left part 522, and a right part 523.

The top part 521 may extend in the left-right direction, and may form a long side of the side cover 52. A horizontal portion 521H may form a rear side of the side cover 52. A vertical portion 521V may intersect with the horizontal portion 521H, and may form an upper side of the side cover 52. A plurality of holes 521*a* may be formed to penetrate the vertical portion 521V in the up-down direction, and may be spaced apart from each other in the left-right direction. The hole 521*a* may be referred to as a heat dissipation hole.

The left part 522 may extend downward from the left end of the top part 521, and may form a short side of the side cover 52. The horizontal portion 522H may form a rear side of the side cover 52. The vertical portion 522V may form a left side of the side cover 52.

The right part 523 may extend downward from the right end of the top part 521, and may form a short side of the side cover 52. The horizontal portion 523H may form a rear side of the side cover 52. The vertical portion 523V may form a right side of the side cover 52.

A rear cover 51 may be located in the rearward of the side cover 52. The rear cover 51 may opposite the mount plate 40 (refer to FIG. 12) with respect to the side cover 52. The rear cover 51 may include an inner part 511 and an outer part 512.

The inner part 511 may be a portion of the rear cover 51 located inside the side cover 52. The size of the inner part 511 may correspond to the size of the mount plate 40 (refer to FIG. 8). The inner part 511 may cover the rearward of the mount plate 40 and the electronic component EP (refer to FIG. 2). The plurality of holes 511*a* may be formed to penetrate the inner part 511 in the front-rear direction. The hole 511*a* may be referred to as a heat dissipation hole.

The outer part 512 may be a portion of the rear cover 51 located outside the side cover 52. The outer part 512 may opposite the inner part 511 with respect to the top part 521 of the side cover 52. In the up-down direction, the length of the outer part 512 may be smaller than the length of the inner part 511. A pattern 51*g* may be formed on the front side of the outer part 512. For example, the pattern 51*g* may be embossed vertical stripes. For example, the pattern 51*g* may be the same as or similar to the pattern 30*g* (refer to FIG. 6) formed on the rear side of the second part 30A2 of the frame 30.

The fastening member Fc, such as a screw, may penetrate the horizontal portion 521H, 522H, and 523H of the side cover 52 to be fastened to the inner part 511. A plurality of fastening members Fc may be disposed along the inner circumference of the side cover 52. Accordingly, the side cover 52 may be coupled to the rear cover 51.

Meanwhile, a rear coupling portion 51Q may protrude from the inner side of the inner part 511 toward the coupling portion 30Q (refer to FIGS. 5 and 6), and may have a hole communicating with the inner side of the coupling portion 30Q. In the front-rear direction, a plurality of rear coupling portions 51Q may be aligned with a plurality of coupling portions 30Q (refer to FIGS. 5 and 6). The plurality of rear coupling portions 51Q may be disposed along the inner circumference of the side cover 51. The fastening member Fd such as a screw may be fastened to the coupling portion 30Q through the rear coupling portion 51Q. Accordingly, the rear cover 51 may be coupled to the frame 30.

Figure 10:
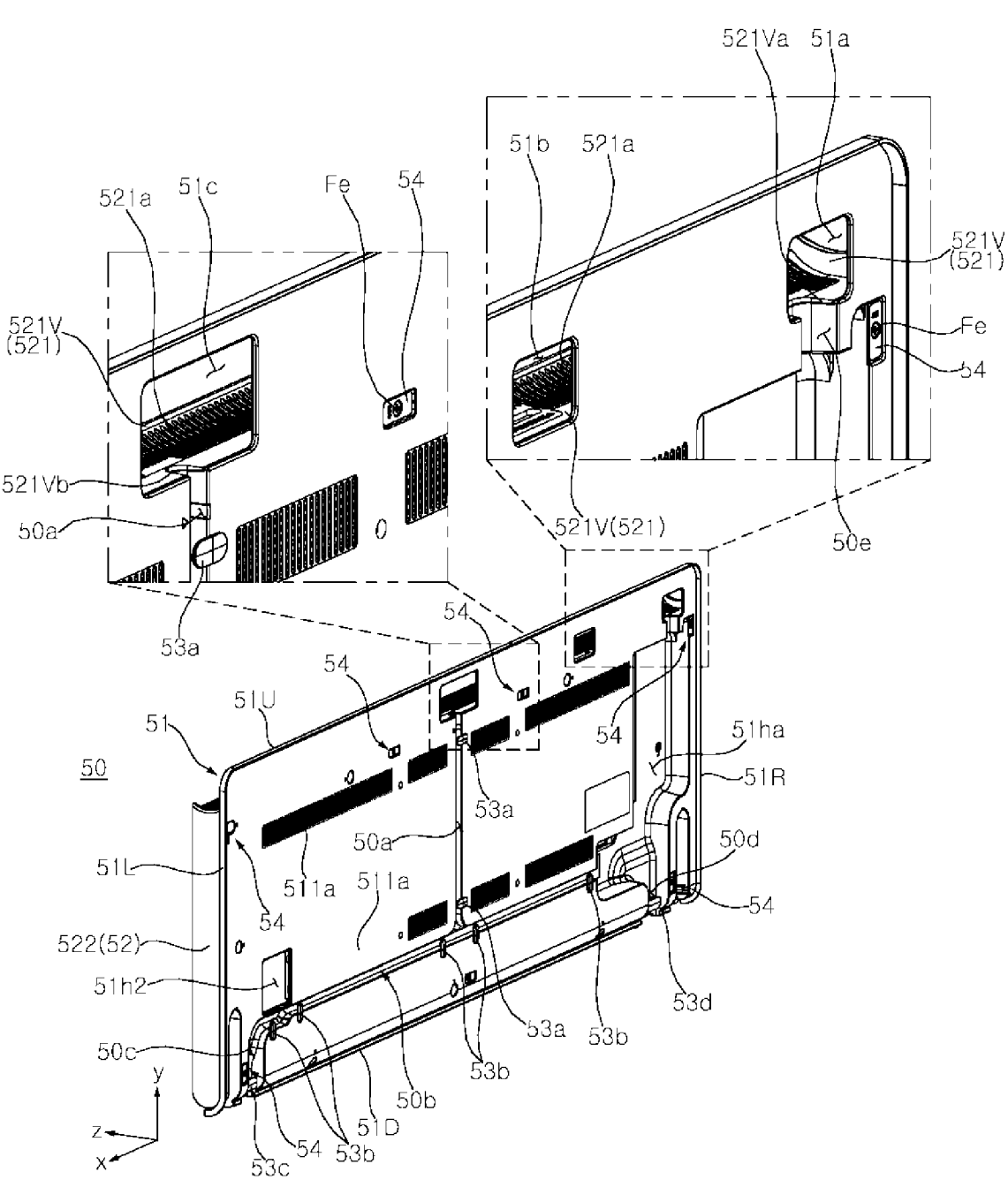

Referring to FIG. 10, a slot 51*a*, 51*b*, 51*c* may be formed to penetrate the rear cover 51 in the front-rear direction. For example, the slot 51*a*, 51*b*, 51*c* may be a rectangular opening. The plurality of slots 51*a*, 51*b*, and 51*c* may be spaced apart from each other in the left-right direction. A first slot 51*a* may be adjacent to the upper and right sides of the rear cover 51. A second slot 51*b* may be spaced apart from the first slot 51*a* to the left. A third slot 51*c* may be spaced apart from the second slot 51*b* to the left.

A recessed portion 51*ha* may be formed while being recessed forward from the rear side of the rear cover 51, and may be adjacent to the right side of the rear cover 51. An opening 51*h*1 (refer to FIG. 9) may be formed to penetrate the lateral side or lateral wall of the recessed portion 51*ha*. For example, a user may connect a video and/or audio input/output terminal, a USB terminal, or a power input terminal to input/output units provided in the main board B3 (refer to FIG. 8) through the opening 51*h*1.

A cover hole 51*h*2 may be formed to penetrate the rear cover 51. The position of the cover hole 51*h*2 may correspond to the position of the power supply board B1 (refer to FIG. 8).

The plurality of grooves 50*a*, 50*b*, 50*c*, 50*d*, and 50*e* may be formed on the rear side of the rear cover 51. The plurality of grooves 50*a*, 50*b*, 50*c*, 50*d*, and 50*e* may have an elongated ditch shape.

A first groove 50*a* may be located in the center of the rear cover 51, and may extend in the up-down direction. An upper end of the first groove 50*a* may be connected to a portion of the rear cover 51 forming a boundary of the third slot 51*c*. A second cut-out 521V*b* may be formed in the vertical portion 521V, and may opposite the first groove 50*a*. The second cut-out 521V*b* may communicate with the first groove 50*a*. A first holder 53*a* may be fixed to the rear side of the rear cover 51, and may cover a part of the rear side of the first groove 50*a*.

A second groove 50*b* may extend left and right from the lower end of the first groove 50*a*. The second groove 50*b* may be adjacent to the lower side of the rear cover 51. A second holder 53*b* may be fixed to the rear side of the rear cover 51, and may cover a part of the rearward of the second groove 50*b*.

A third groove 50*c* may extend downward from the left end of the second groove 50*b*, and may be formed in a part of the lower side of the rear cover 51. The third groove 50*c* may be adjacent to the left side of the rear cover 51. A third holder 53*c* may be located in the third groove 50*c*, may be fixed to the rear cover 51, and may have a path communicating with the third groove 50*c*.

A fourth groove 50*d* may extend downward from the right end of the second groove 50*b*, and may be formed in a part of the lower side of the rear cover 51. The fourth groove 50*d* may be adjacent to the right side of the rear cover 51. The aforementioned recessed portion 51*ha* may be located between the second groove 50*b* and the fourth groove 50*d*, and may connect the second groove 50*b* and the fourth groove 50*d*. Here, the recessed portion 51*ha* may be adjacent to the right side of the rear cover 51, and may have a puddle shape. A fourth holder 53*d* may be located in the fourth groove 50*d*, may be fixed to the rear cover 51, and may have a path communicating with the fourth groove 50*d*.

A fifth groove 50*e* may extend from the upper end of the recessed portion 51*ha* toward the first slot 51*a*. An upper end of the fifth groove 50*e* may be connected to a portion of the rear cover 51 forming a boundary of the first slot 51*a*. A first cut-out 521V*a* may be formed in the vertical portion 521V, and may opposite the fifth groove 50*e*. The first cut-out 521V*a* may communicate with the fifth groove 50*e*.

A magnetic substance 54 such as iron Fe may be coupled to the rear side of the rear cover 51 through, for example, a fastening member Fe such as a screw. A plurality of magnetic substances 54 may be disposed along the circumference of the rear cover 51.

Figure 11:
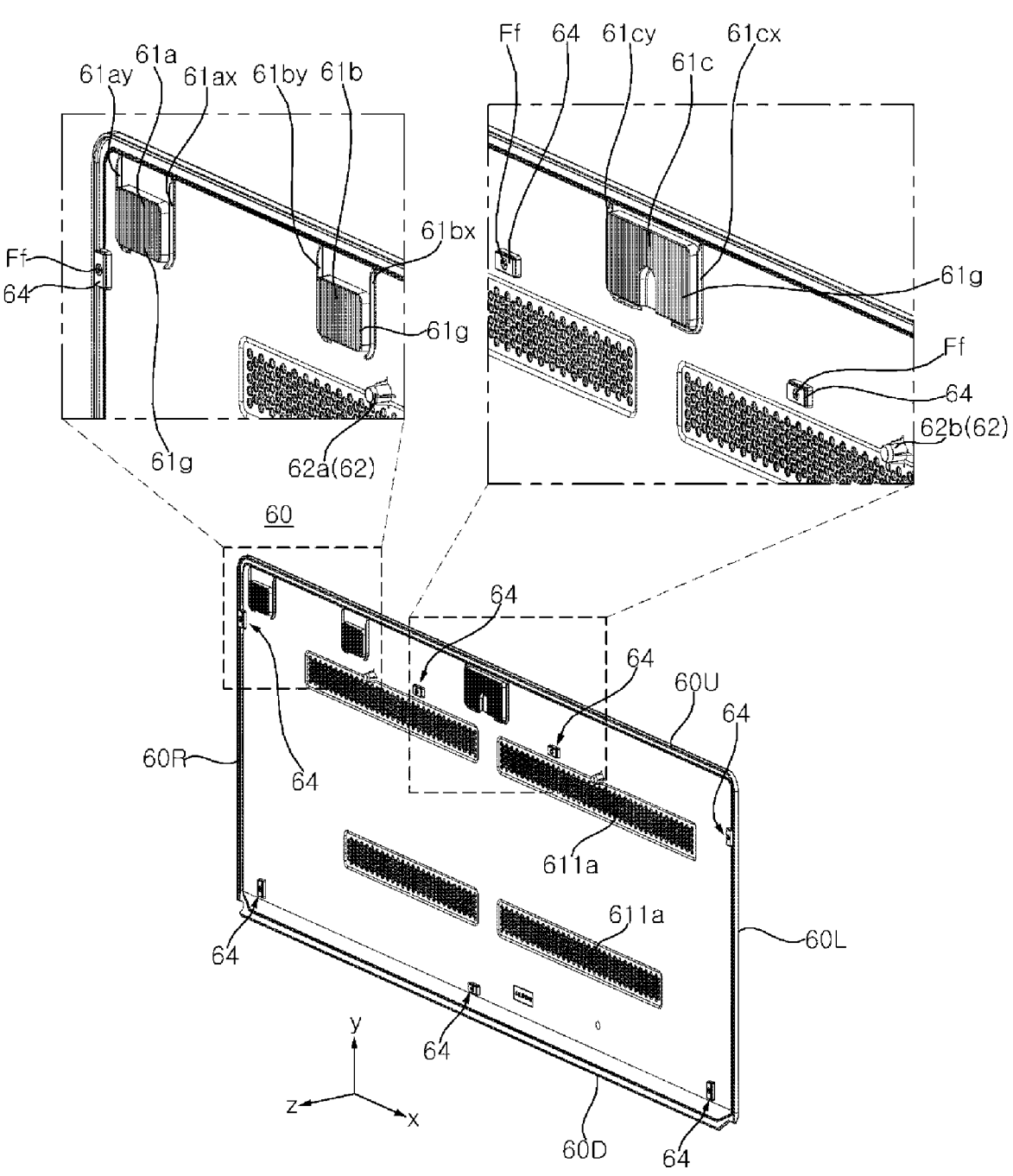
Figure 12:
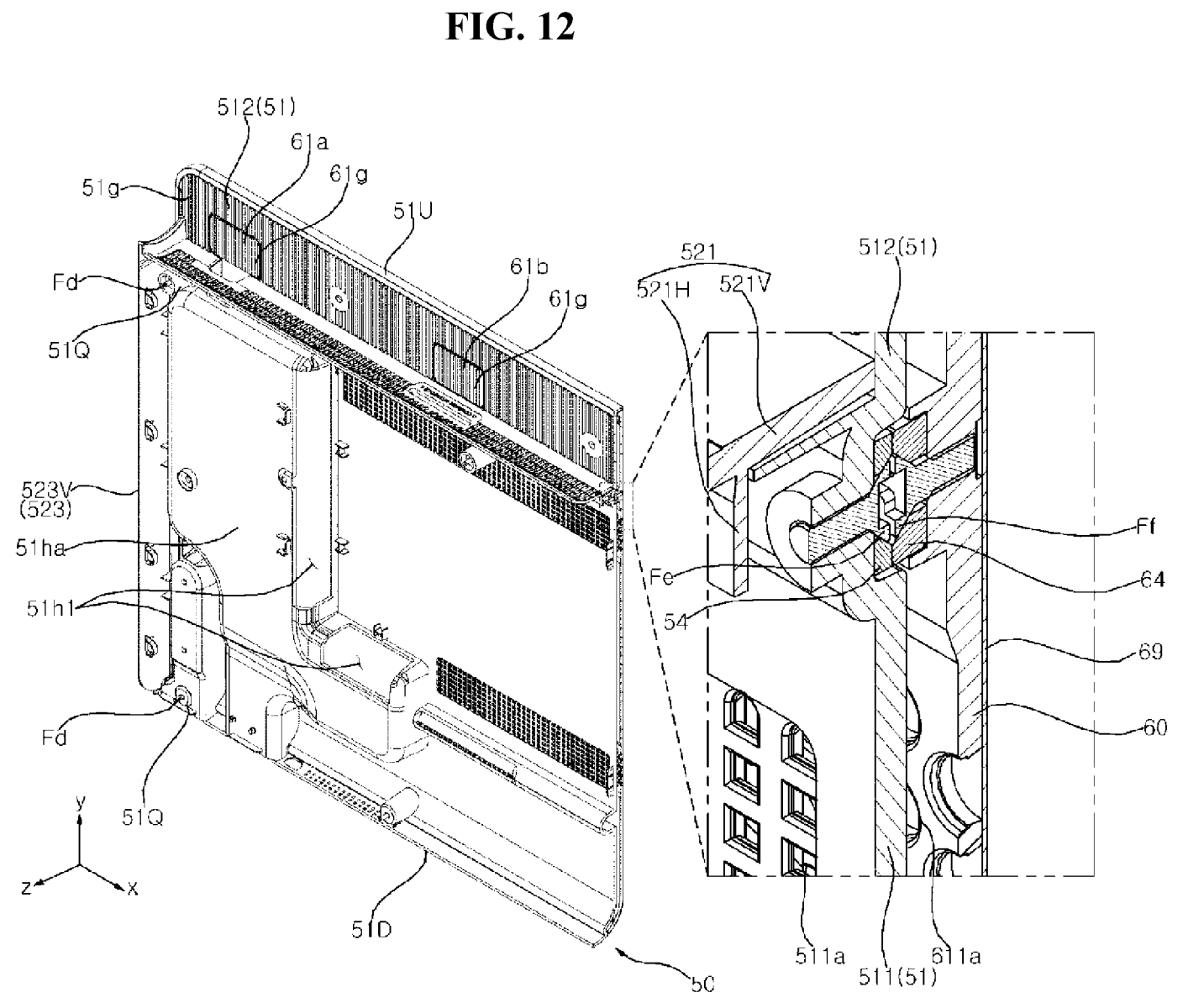

Referring to FIGS. 11 and 12, the end cover 60 may be located in the rearward of the back cover 50. The size of the end cover 60 may correspond to the size of the rear cover 51 of the back cover 50. The plurality of holes 611*a* may be formed to penetrate the end cover 60 in the front-rear direction. The hole 611*a* may face the hole 511*a*, and may be referred to as a heat dissipation hole.

A block 61*a*, 61*b*, 61*c* may protrude toward the slot 51*a*, 51*b*, 51*c* from the front side of the end cover 60. The block 61*a*, 61*b*, 61*c* may have a size corresponding to the slot 51*a*, 51*b*, 51*c*. A first block 61*a* may be inserted into the first slot 51*a*, and a pattern 61*g* identical to or similar to the pattern 51*g* may be formed. A second block 61*b* may be inserted into the second slot 51*b*, and a pattern 61*g* identical to or similar to the pattern 51*g* may be formed. A third block 61*c* may be inserted into the third slot 51*c*, and a pattern 61*g* identical to or similar to the pattern 51*g* may be formed.

A magnet 64 may be coupled to the front side of the end cover 60 through, for example, a fastening member Ff such as a screw. A plurality of magnets 64 may be disposed along the circumference of the end cover 60. In the front-rear direction, the plurality of magnets 64 may be aligned with the plurality of magnetic substances 54. Accordingly, the end cover 60 may be coupled to the rear cover 51 through magnetic coupling between the magnet 64 and the magnetic substance 54. Meanwhile, depending on an embodiment, a magnetic substance is provided in the end cover 60 and a magnet is provided in the rear cover 51, or a pair of magnets which have a mutual magnetic attraction may be provided respectively in the rear cover 51 and the end cover 60.

Figure 13:
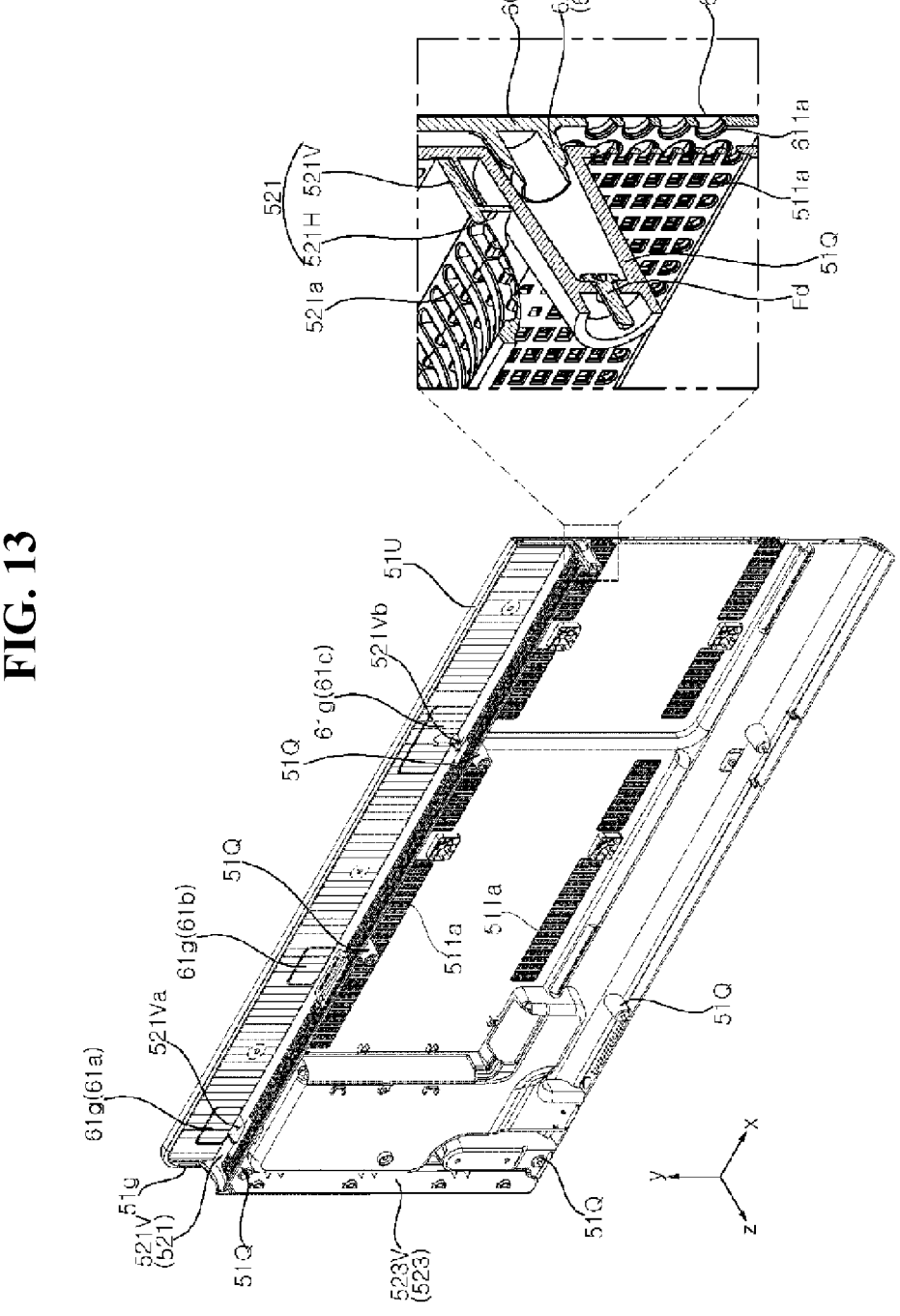

Referring to FIGS. 11 and 13, a guide protrusion 62 may protrude forward from the front side of the end cover 60. For example, the plurality of guide protrusions 62*a* and 62*b* may be provided on the front side of the end cover 60, and may be spaced apart from each other.

In the front-rear direction, the guide protrusion 62 may be aligned with the rear coupling portion 51Q of the rear cover 51. The guide protrusion 62 may be inserted into the rear coupling portion 51Q. Accordingly, the rear coupling portion 51Q may restrict the up-down and left-right flow, i.e. horizontal flow, of the guide protrusion 62 and the end cover 60. In addition, the guide protrusion 62 may guide the coupling between the end cover 60 and the rear cover 51.

Figure 14:
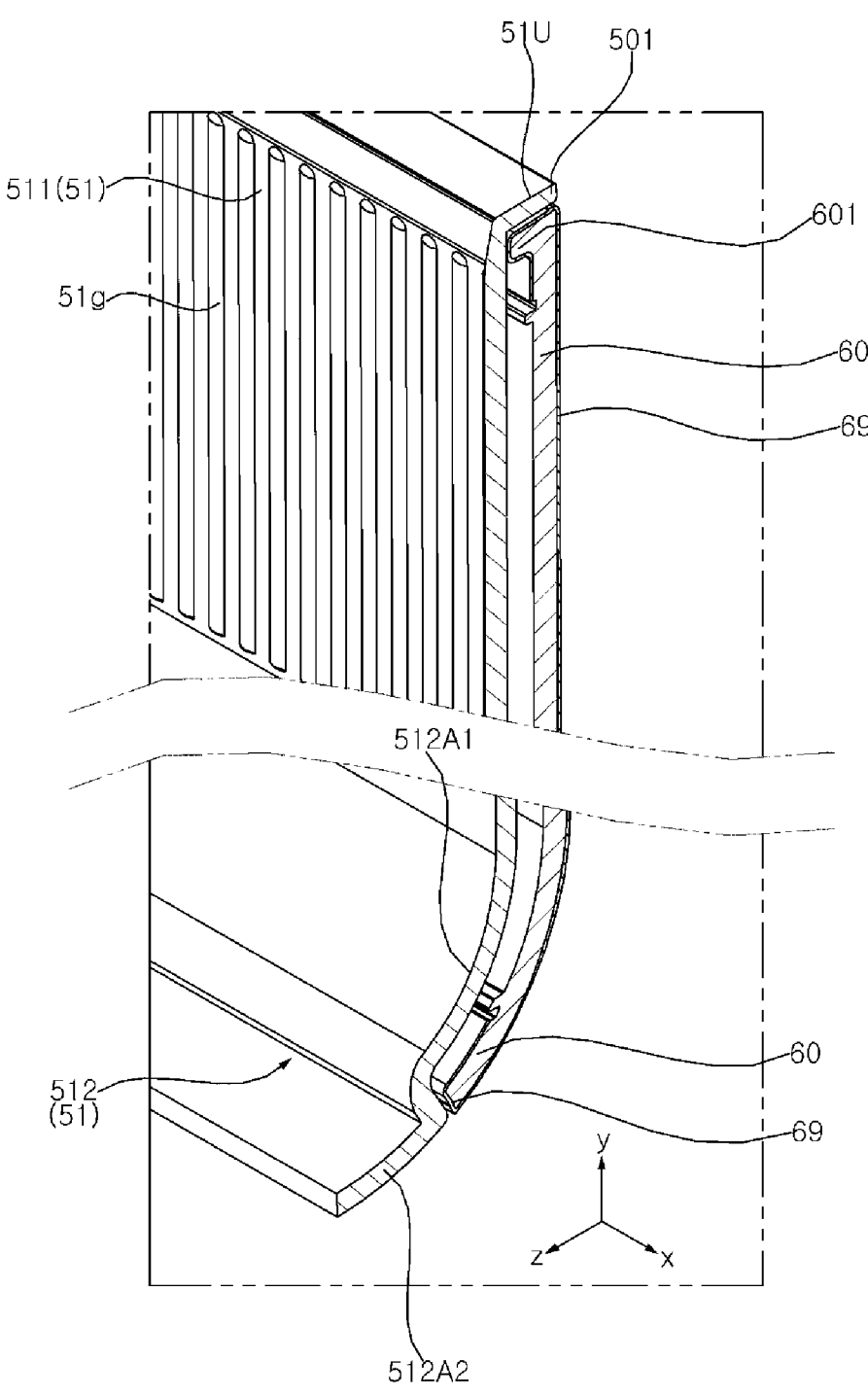

Referring to FIG. 14, a bending portion 501 of the rear cover 51 may be formed while being bent rearward from the periphery of the rear cover 51, and may form an upper side 51U, a left side 51L (refer to FIG. 10), and a right side 51R (refer to FIG. 10). A curved portion 512A1, 512A2 may form a lower portion of the rear cover 51, and may be curved. A second curved portion 512A2 may form a step difference with respect to a first curved portion 512A1, and may form a lower side 51D of the rear cover 51.

A bending portion 601 of the end cover 60 may be formed while being bent forward from the periphery of the end cover 60, and may form the upper side 60U (refer to FIG. 11), the left side 60L (refer to FIG. 11), and the right side 60R (refer to FIG. 11) of the end cover 60. A curved portion 60A may form the lower portion of the end cover 60, and may be curved.

A jersey 69 may cover the rearward of the end cover 60. Alternatively, the jersey 69 may form a rear side of the end cover 60 as one configuration of the end cover 60. The jersey 69 may wrap the edge of the end cover 60, and may be adhered or fused to the front side of the end cover 60. The jersey 69 may include a fabric material.

Figure 15:
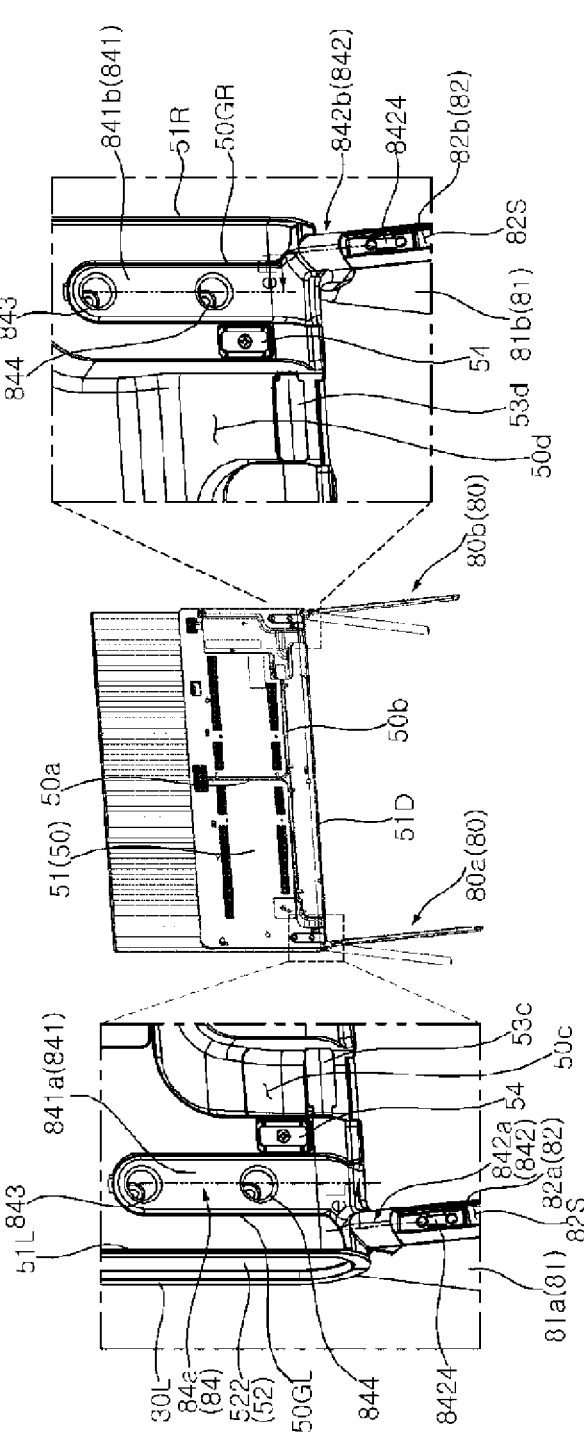

Referring to FIG. 15, the stand 80 may support the head. The stand 80 may separate the head to the upward side from the ground. The stand 80 may support the rear side of the head. The stand 80 may support the lower side of the head. The stand 80 may be located between the back cover 50 and the end cover 60. The stand 80 may be coupled to the back cover 50. The stand 80 may be coupled to the rear cover 51.

The stand 80 may include a pair of stands 80a and 80b spaced apart from each other in the left-right direction. A first stand 80a may be adjacent to the left side of the head. The first stand 80a may be adjacent to the left side 51L of the rear cover 51. A second stand 80b may be adjacent to the right side of the head. The second stand 80b may be adjacent to the right side 51R of the rear cover 51. The first stand 80a and the second stand 80b may have the same structure. The first stand 80a and the second stand may be symmetrical left and right. The first stand 80a and the second stand 80b may extend in the up-down direction, and may be symmetrical left and right with respect to a center line passing through the center of the head.

The stand 80 may include a neck 84 and a leg 81, 82. The first stand 80a may include a neck 84a and a leg 81, 82, and the second stand 80b may include a neck 84b and the leg 81b, 82b. The leg 81, 82 of the first stand 80a may be offset to the left with respect to the neck 84a of the first stand 80a (refer to eL of FIG. 15). The leg 81b, 82b of the second stand 80b may be offset to the right with respect to the neck 84b of the second stand 80b (refer to eR of FIG. 15). The horizontal distance between the neck 84a of the first stand 80a and the neck 84b of the second stand 80b may be smaller than the horizontal distance between the leg 81a, 82a of the first stand 80a and the leg 81b, 82b of the second stand 80b.

Figure 16:
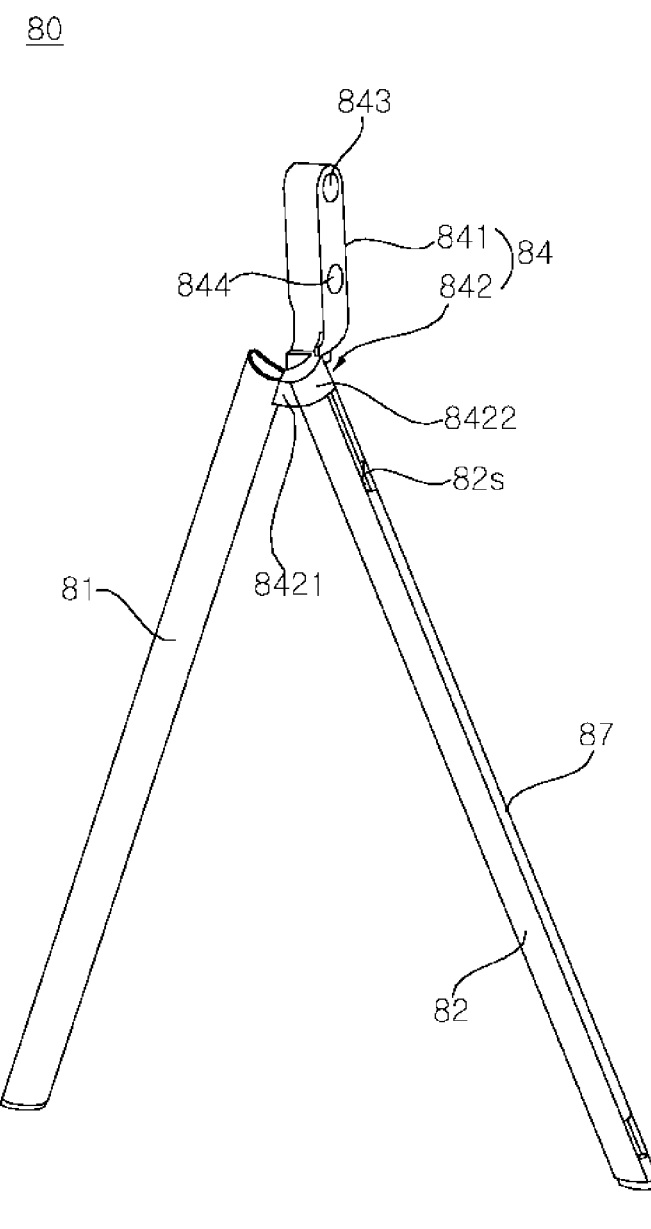

Referring to FIG. 16, the stand 80 may include a neck 84, a reinforcing plate 83, and a leg 81, 82.

Figure 17:
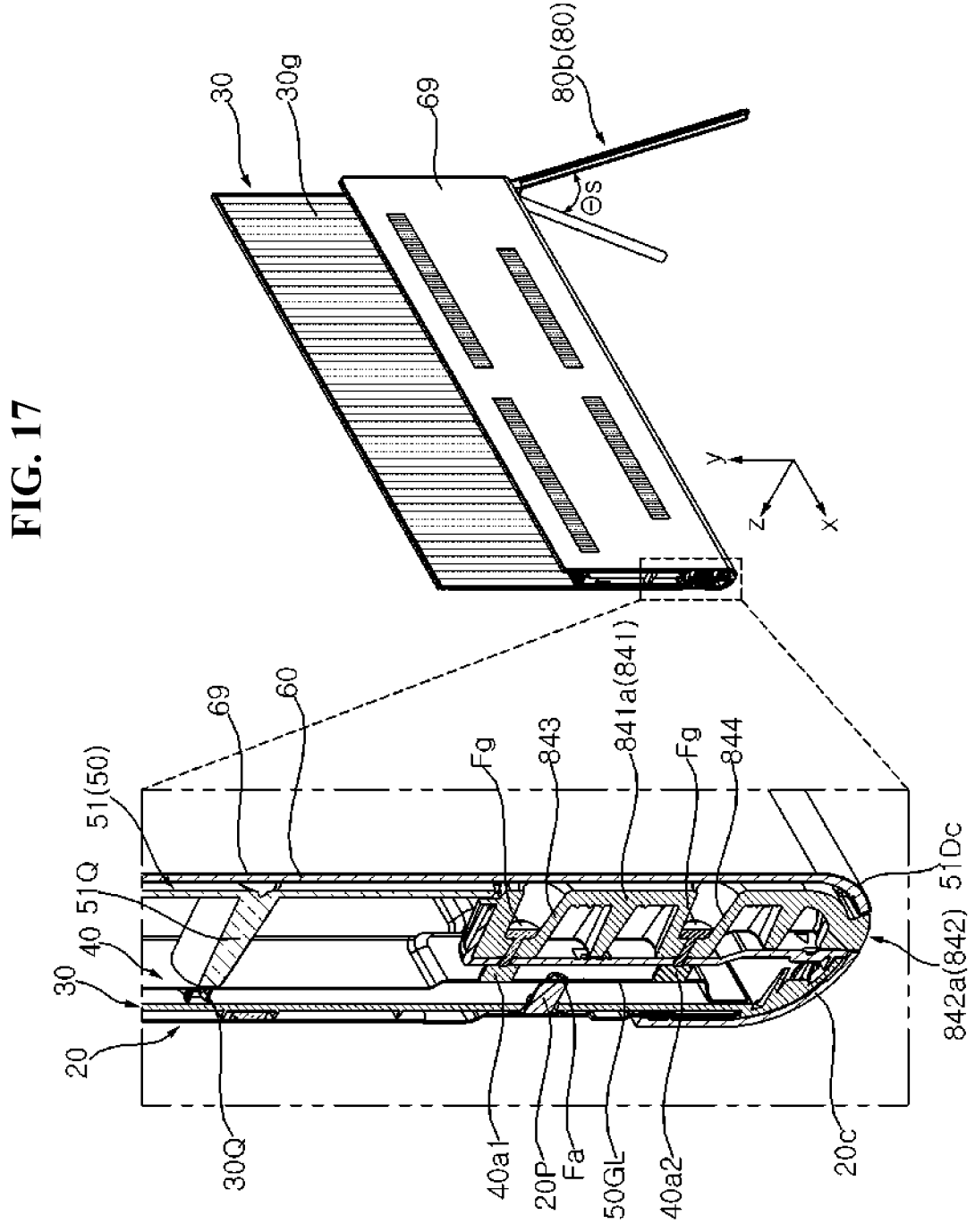

Referring to FIGS. 15, 16 and 17, the neck 84 may support the rear side of the head. The neck 84 may support the lower side of the head. The neck 84 may be coupled to the rear side of the head, and a portion thereof may be located below the lower side of the head. A part of the neck 84 may protrude forward or rearward than the leg 81, 82. The neck 84 may include a first supporter 841 for supporting the rear side of the head, and a second supporter 842 for supporting the lower side of the head. The second supporter 842 may protrude forward or rearward than the leg 81, 82.

The first supporter 841 may be coupled to the rear side of the head. The first supporter 841 may be disposed between the back cover 50 and the end cover 60. The first supporter 841 may be coupled to the rearward of the back cover 51. The end cover 60 may cover the first supporter 841.

A coupling groove 50GL, 50GR (refer to FIG. 9) may be formed while being pressed forward from the rear side of the rear cover 51, and may be adjacent to the lower side 51D of the rear cover 51. A first coupling groove 50GL may be adjacent to the left side 51L of the rear cover 51, and a second coupling groove 50GR may be adjacent to the right side 51R of the rear cover 51.

The first supporter 841 may be coupled to the rearward of the rear cover 51. The first supporter 841 may be inserted into the coupling groove 50GL, 50GR. The first supporter 841a of a first neck 84a may be inserted into the first coupling groove 50GL. The first supporter 841b of a second neck 84b may be inserted into the second coupling groove 50GR.

A neck fixing portion 843, 844 may be formed while being pressed toward the coupling groove 50GL, 50GR from the rear side of the neck 84. For example, the neck fixing portion 843, 844 may include a pair of neck fixing portions 843, 844 spaced apart from each other in the vertical direction. A neck coupling portion 40a1, 40a2 may protrude toward the coupling groove 50GL, 50GR from the rear side of the mount plate 40. The neck fixing portion 843, 844 may be aligned with the neck coupling portion 40a1, 40a2 in the front-rear direction. A fastening member Fg, such as a screw, may be fastened to the neck coupling portion 40a1, 40a2 through the neck fixing portion 843, 844. Through this, the stand 80 may be disposed between the back cover 50 and the end cover 60. The stand 80 may be coupled to the back cover 50. The stand 80 may be coupled to the mount plate 40 through the back cover 50.

Figure 18:
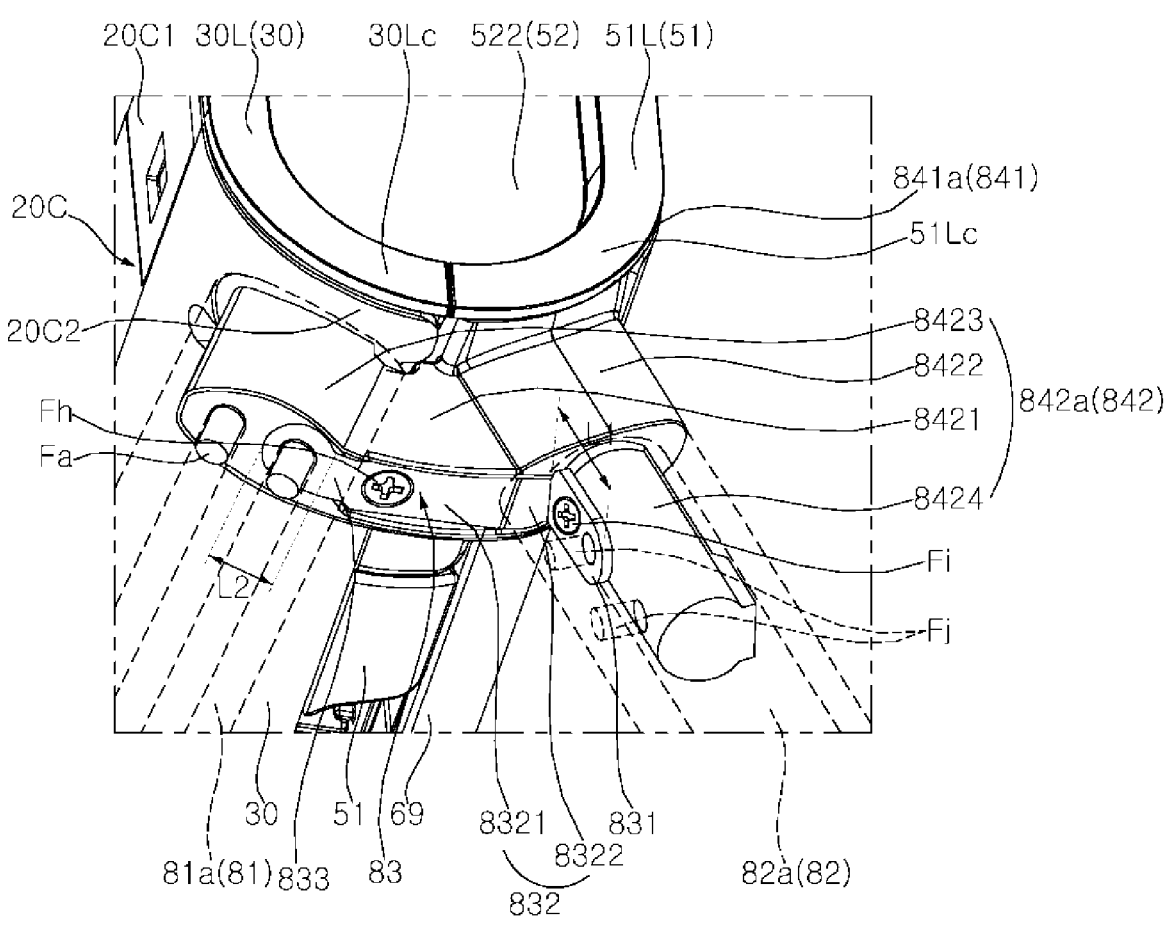

Referring to FIGS. 16 and 18, the second supporter 842 may extend downward from the first supporter 841. The second supporter 842 may be located below the lower side of the head. The second supporter 842 may extend from the first supporter 841 to one side. For example, the second supporter 842a of the first stand 80a may extend to the left from the first supporter 841a, and the second supporter 842b of the second stand 80b may extend to the right from the first supporter 841b (refer to FIG. 15).

The lower side of the head may include first to third areas. A first area may be located between a second area and a third area. The first area may mean a central area of the lower side of the head. The first area may mean a portion where a lower portion 30Lc of the left side 30L of the frame 30 meets a lower portion 51Lc of the left side 51L of the rear cover 51. The first area may include a flat surface at least in part. The second area may be located in the rearward of the first area. The second area may mean the lower portion 51Lc of the left side 51L of the rear cover 51. The second area may have a curved shape. The second area may have a downward convex shape in a direction from the rearward of the head to the forward. The third area may be located in the forward of the first area. The third area may mean the lower portion 30Lc of the left side 30L of the frame 30. The third area may have a downward convex shape in a direction from the forward to the rearward. The first to third areas may be combined to have a semicircular shape with a flat upper side.

The second supporter 842 may include a first portion 8421 supporting the first area of the lower side of the head. The second supporter 842 may include a second portion 8422 supporting the second area of the lower side of the head. The second supporter 842 may include a third portion 8423 supporting the third area of the lower side of the head.

The first portion 8421 may be located between the second portion 8422 and the third portion 8423. The first portion 8421 may be located between a first leg 81 and a second leg 82. The first portion 8421 may be located between the second portion 8422 and the upper end of the first leg 81. The first portion 8421 may be located in front of the first supporter 841. The first portion 8421 may include a first surface to which the second portion 8422 is connected, and a second surface to which the third portion 8423 is connected. The first surface and the second surface of the first portion 8421 may form an acute angle. The horizontal distance between the first surface and the second surface of the first portion 8421 may increase as it progresses downward. The cross section of the first portion 8421 may include at least one of a triangular shape, a sectoral shape, and a trapezoidal shape with an upper side shorter than a lower side. The first portion 8421 may include a lower surface that connects the first surface and the second surface, and is located in the downward side. A lower surface of the first portion 8421 may be curved. Alternatively, the lower surface of the first portion 8421 may be flat.

The second portion 8422 may be curved upwardly of rearward with respect to the first portion 8421. The cross-section of the second portion 8422 may have an elliptical shape. The second portion 8422 may have a cylindrical shape. The upper surface of the second leg 82 may be located on the lower surface of the second portion 8422. The cross-section of the second portion 8422 may have a shape corresponding to the cross-section of the second leg 82. The diameter in the long axis direction of the second portion 8422 may correspond to the diameter in a corresponding direction of the second leg 82. The diameter in the short axis direction of the second portion 8422 may correspond to the diameter in the corresponding direction of the second leg 82.

The second supporter 842 may include a fourth portion 8424 protruding from the lower surface of the second portion 8422 in the extending direction of the second leg 82. The fourth portion 8424 may be located inside the second leg 82. The fourth portion 8424 may be formed in a cylindrical shape having a smaller cross-section than the second portion 8422. The fourth portion 8424 may be coupled to the second leg 82.

The third portion 8423 may be bent upwardly of forward with respect to the first portion 8421. The cross-section of the third portion 8423 may have an elliptical shape. The third portion 8423 may be accommodated inside the first leg 81. The third portion 8423 may be coupled to the first leg 81.

The first to fourth portions 8421, 8422, 8423, and 8424 may be formed as one body. The first to third portions 8421, 8422, and 8423 may be combined to form a 'U' shape or a 'V' shape.

Referring to FIGS. 16 to 18, the stand 80 may include the leg 81, 82. The leg 81, 82 may allow the head to be separated upward from the ground. The leg 81, 82 may separate the head from the ground to a set height. The leg 81, 82 may support the head. The leg 81, 82 may opposite the head with respect to the second supporter 841. The leg 81, 82 may extend downward from the head.

The leg 81, 82 may include a single leg. In this case, the upper end of the leg may be coupled to the lower side of the head, and the lower end of the leg may be located on the ground. In addition, a base of a circular plate or a square plate may be coupled to the lower end of the leg.

The leg 81, 82 may include a plurality of legs 81, 82. The leg 81, 82 may include a first leg 81 and a second leg 82. The first leg 81 may extend downward from the head. The second leg 82 may extend downward from the head. The first leg 81 and the second leg 82 may be spaced apart from each other in the front-rear direction. The first leg 81 and the second leg 82 may overlap in the front-rear direction. The separation distance in the front-rear direction between the first leg 81 and the second leg 82 may increase from top to bottom. The first leg 81 may be located in the forward of the head, and the second leg 82 may be located in the rearward of the head. The extending direction of the first leg 81 may be different from the extending direction of the second leg 82. The first leg 81 may extend to be inclined downwardly of forward from the lower side of the head, and the second leg 82 may extend to be inclined downwardly of rearward from the lower side of the head. In this case, a certain angle theta (s) may be formed between the first leg 81 and the second leg 82. For example, the angle theta (s) between the first leg 81 and the second leg 82 may be an acute angle. As another example, the angle theta (s) between the first leg 81 and the second leg 82 may be an obtuse angle. However, the present disclosure is not limited thereto, and the separation distance between the head and the ground may be adjusted by adjusting the angle between the first leg 81 and the second leg 82.

Meanwhile, one of the first leg 81 and the second leg 82 may extend in a vertical direction, and the other leg may extend to be inclined with respect to the vertical direction. For example, the first leg 81 may extend in a vertical direction from the lower side of the head, and the second leg 82 may extend to be inclined downwardly of rearward with respect to the first leg 81. As another example, the second leg 82 may extend in a vertical direction from the lower side of the head, and the first leg 81 may extend to be inclined downwardly of forward with respect to the second leg 82.

Referring to FIG. 18, the stand 80 may include a reinforcing plate 83. The reinforcing plate 83 may be coupled to the leg 81, 82. The reinforcing plate 83 may be coupled to any one of the first leg 81 and the second leg 82. For example, the reinforcing plate 83 may be coupled to the first leg 81, and a part (the first portion 8421 of the second supporter 842) of the neck 84 located between the first leg 81 and the second leg 82. For another example, the reinforcing plate 83 may be coupled to the second leg 82, and a part (the first portion 8421 of the second supporter 842) of the neck 84 located between the first leg 81 and the second leg 82. The reinforcing plate 83 may be coupled to the second supporter 842. The reinforcing plate 83 may be coupled to both the leg 81, 82 and the second supporter 842. The reinforcing plate 83 may include a first part 831. The reinforcing plate 83 may include a second part 832. The reinforcing plate 83 may include a third part 833. The second part 832 may be disposed between the first part 831 and the third part 833.

The first part 831 may be located in the rearward than the first part 832. The first part 831 may extend rearward from the second part 832. The first part 831 may be coupled to the second leg 82. The first part 831 may be coupled to the fourth part 8424 of the second supporter 842. The first part 831 may be bent with respect to the second part 832. The first part 831 may extend along the extending direction of the second leg 82. The first part 831 may extend along the fourth part 8424 of the second supporter 842.

The first part 831 may be coupled to the fourth part 8424 of the second supporter 842 and the second leg 82. The first part 831 may include a coupling hole (no reference numeral, refer to FIG. 18) penetrating the first part 831 in the front-rear direction. The coupling hole of the first part 831 may include a plurality of coupling holes. The plurality of coupling holes may include a first coupling hole (no reference numeral, refer to FIG. 18), and a second coupling hole (no reference numeral, refer to FIG. 18) spaced apart from the first coupling hole in the extending direction of the second leg 82.

A fastening member Fi such as a screw may be inserted into the first coupling hole. The first part 831 and the fourth part 8424 of the second supporter 842 may be coupled through the fastening member Fi. A fastening member Fi such as a screw may be inserted into the second coupling hole. The fastening member Fi may penetrate the first part 831 and the fourth part 8424 of the second supporter 842, and may be coupled to the inner wall surface of the second leg 82. The fourth part 8424 of the second supporter 842, the first part 831, and the second leg 82 may be coupled to each other through the fastening member Fi.

The second part 832 may be disposed between the first part 831 and the third part 833. The second part 832 may be coupled to the lower surface of the first portion 8421 of the second supporter 842. The second part 832 may be coupled to the lower surface of the first portion 8421 of the second supporter 842 through the fastening member Fh. The second part 832 may be provided as a flat plate. The second part 832 may be bent with respect to the first part 831.

The second part 832 may include a second-first part 8321 disposed on the lower surface of the first portion 8421 of the second supporter 842, and a second-second part 8322 that extends rearward from the second-first part 8321 and is disposed on the lower surface of the second portion 8422 of the second supporter 842. The second-first part 8321 may be connected to the third part 833, and the second-second part 8322 may be connected to the first part 831. The second-first part 8321 may be coupled to the first portion 8421 of the first supporter 842 through the fastening member Fh.

The third part 833 may be coupled to the first leg 81. The third part 833 may extend forward from the second part 832. The third part 833 may be coupled to the lower surface of the third portion 8423 of the second supporter 842. The third portion 8423 may include a coupling hole 8423a, 8423b penetrating the upper surface 8423c and the lower surface 8423d of the third portion 8423. The coupling hole 8423a, 8423b may include a plurality of coupling holes. The coupling hole 8423a, 8423b may include a first coupling hole 8423a and a second coupling hole 8423b that are spaced apart from each other. A fastening member Fa may be inserted into the first coupling hole 8423a and the second coupling hole 8423b. The third part 833 may be disposed in a portion of the lower surface of the third portion 8423 in which the second coupling hole 8423b is formed. The third part 833 may be coupled to the lower surface of the third part 833 through the fastening member Fa. The third part 833 may be coupled to the lower surface of the third part 833 and the first leg 81 through the fastening member Fa.

The reinforcing plate 83 may alternatively include at least two of the first to third parts 831, 832, and 833. For example, the reinforcing plate 83 may include the second part 832 and the first part 831. Thus, when an external impact is applied to the head, the head can be prevented from falling rearward, through the first supporter 841 for supporting the rear side of the head, the second part 832 of the reinforcing plate 83 coupled to the first portion 8421 of the second supporter 842 located in the forward of the first supporters 841, and the first part 831 of the reinforcing plate 83 that extends along the second leg 82 and is coupled to the second leg 82. In addition, even when the first supporter 841 or the second supporter 842 is damaged by an external impact, the head can be stably supported by the reinforcing plate 83.

As another example, the reinforcing plate 83 may include the second part 832 and the third part 833. Thus, when an external impact is applied to the head, the head can be prevented from falling forward, through the first supporter 841 for supporting the rear side of the head, the second part 832 of the reinforcing plate 83 coupled to the first portion 8421 of the second supporter 842 located in the forward of the first supporters 841, and the third part 833 of the reinforcing plate 83 coupled to the first leg 81. In addition, even when the first supporter 841 or the second supporter 842 is damaged by an external impact, the head can be stably supported by the reinforcing plate 83.

The first to third parts 831, 832, and 833 may be formed as one body.

Extending directions of the first to third parts 831, 832, and 833 of the reinforcing plate 83 may be different from each other. The second part 832 may extend in a horizontal direction. The second part 832 may extend in a direction perpendicular to the extending direction of the first supporter 841. The first part 831 may be bent downward from one end portion of the second part 832. The second part 831 may be bent from one end portion of the second part 832 in the extending direction of the second leg 82. The third part 833 may be bent upward from the other end portion of the first part 831. The third part 833 may be bent toward the upper surface of the first leg 81 from the other end portion of the first part 831. Thus, the head can be supported according to the direction in which an external impact is applied to the head.

The first part 831 may be bent while forming a first angle with respect to the second part 832. The third part 833 may be bent while forming a second angle with respect to the second part 832. The first part 831 may be bent while forming a first angle downward with respect to the second part 832. The third part 833 may be bent while forming a second angle upward with respect to the second part 832. The second angle may be greater than the first angle. A direction in which the first part 831 is bent with respect to the second part 832 may be different from a direction in which the third part 833 is bent with respect to the second part 832. Thus, the head having the center of gravity located in the rearward can be more firmly supported by an electronic component EP or the like. In addition, when an external impact is applied to the display device 1, the display device 1 may be supported in various directions in which an external impact is applied.

The first part 831 of the reinforcing plate 83 may have a first length L1 in the extending direction of the first part 831. The third part 833 of the reinforcing plate 83 may have a second length L2 in the extending direction of the third part 833. In this case, the first length L1 may be longer than the second length L2. Thus, the head having the center of gravity located in the rearward can be more firmly supported by an electronic component EP or the like.

The reinforcing plate 83 may be fixed to the second supporter 842, and the rigidity of the second supporter 842 connecting the first leg 81 and the second leg 82 may be improved. Accordingly, the stand 80 can stably support the head by the reinforcing plate 83 even if the neck 84 is damaged.

Figure 19:
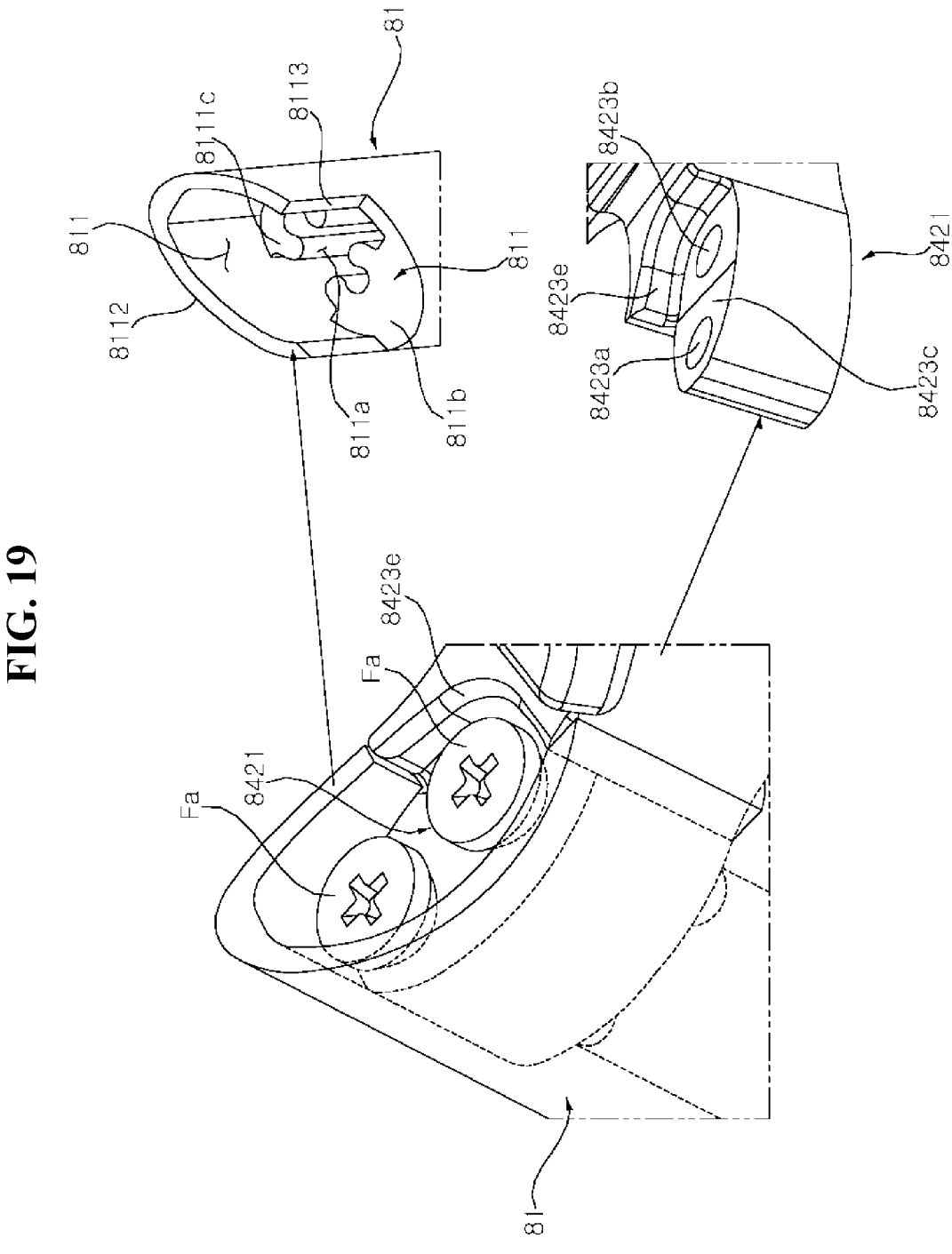

Referring to FIG. 19, the first leg 81 may include a groove 811. The groove 811 may be formed by being recessed from the upper surface of the first leg 81 in the extending direction of the first leg 81. The upper surface of the first leg 81 may be a surface facing the third area of the head of the first leg 81. The upper surface of the first leg 81 may contact the third area of the head. The groove 811 may include a bottom portion 8111 and a side portion 8112 extending upwardly from an outer edge area of the bottom portion 8111. The first leg 81 may include one side portion 8111b and the other side portion 8111c that are spaced apart from each other, and a space portion 8111a between the one side portion 8111b and the other side portion 8111c. The space portion 8111a may extend in an extending direction of the first leg 81. The space portion 8111a may be formed in an entire area of the first leg 81. Alternatively, the space portion 8111a may be formed in a partial area of the first leg 81. The space portion 8111a may be opened toward the bottom portion 8111 of the groove 811. The distal end of the fastening member Fa penetrating the third portion 8423 of the second supporter 842 and the third part 833 of the reinforcing plate 83 may be inserted into the space portion 8111a. Thus, the first leg 81, the reinforcing plate 83, and the second supporter 842 may be fixed together. Cost can be reduced through the space portion 8111a.

The groove 811 may include an opening portion 8113 formed in the side portion 8112. The opening portion 8113 may be formed by cutting out at least a part of the side portion 8112. The opening portion 8113 may be opened toward the first portion 8421 of the second supporter 842. A connection portion between the first portion 8421 and the third portion 8423 of the second supporter 842 may be disposed in the opening portion 8113. The opening portion 8113 may be blocked by the connection portion between the first portion 8421 and the third portion 8423.

The third portion 8423 of the second supporter 842 may include a protrusion 8423*e* extending upward from at least a part of an outer edge area of the third portion 8423. The protrusion 8423*e* may be located above the connection portion between the first portion 8421 and the third portion 8423. The protrusion 8423*e* may have a shape engaged with the opening portion 8113 of the groove 811. The protrusion 8423*e* may block the opening portion 8113 of the groove 811.

Figure 20:
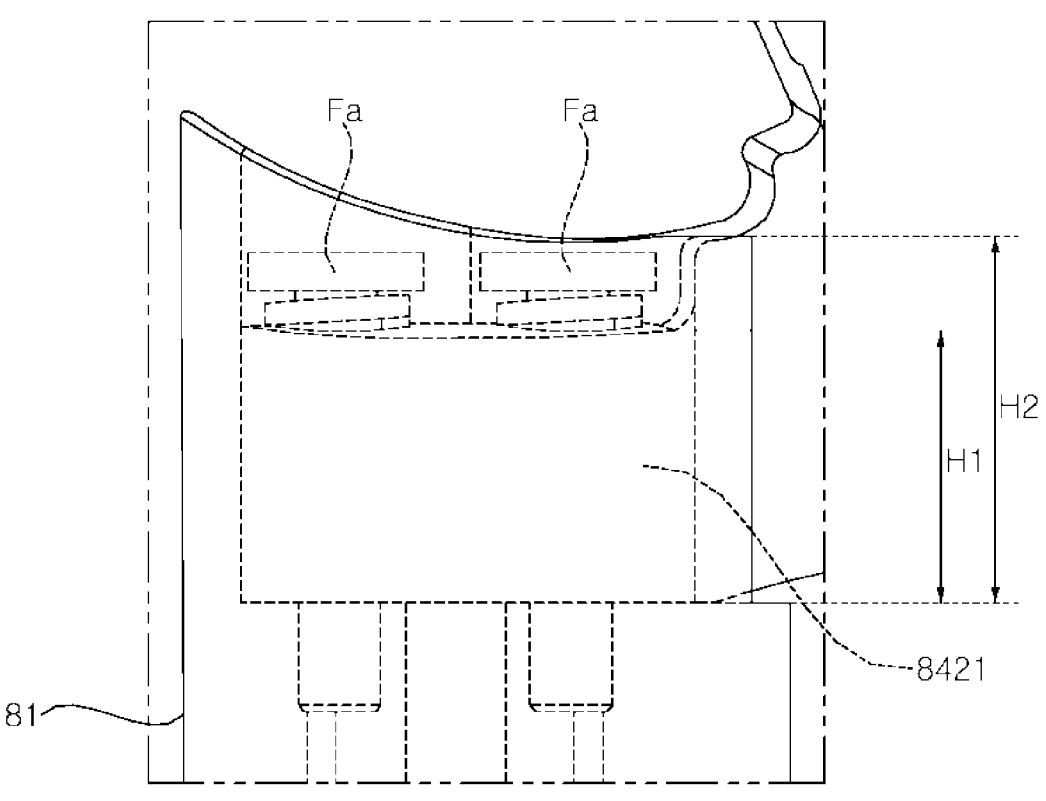
Figure 21:
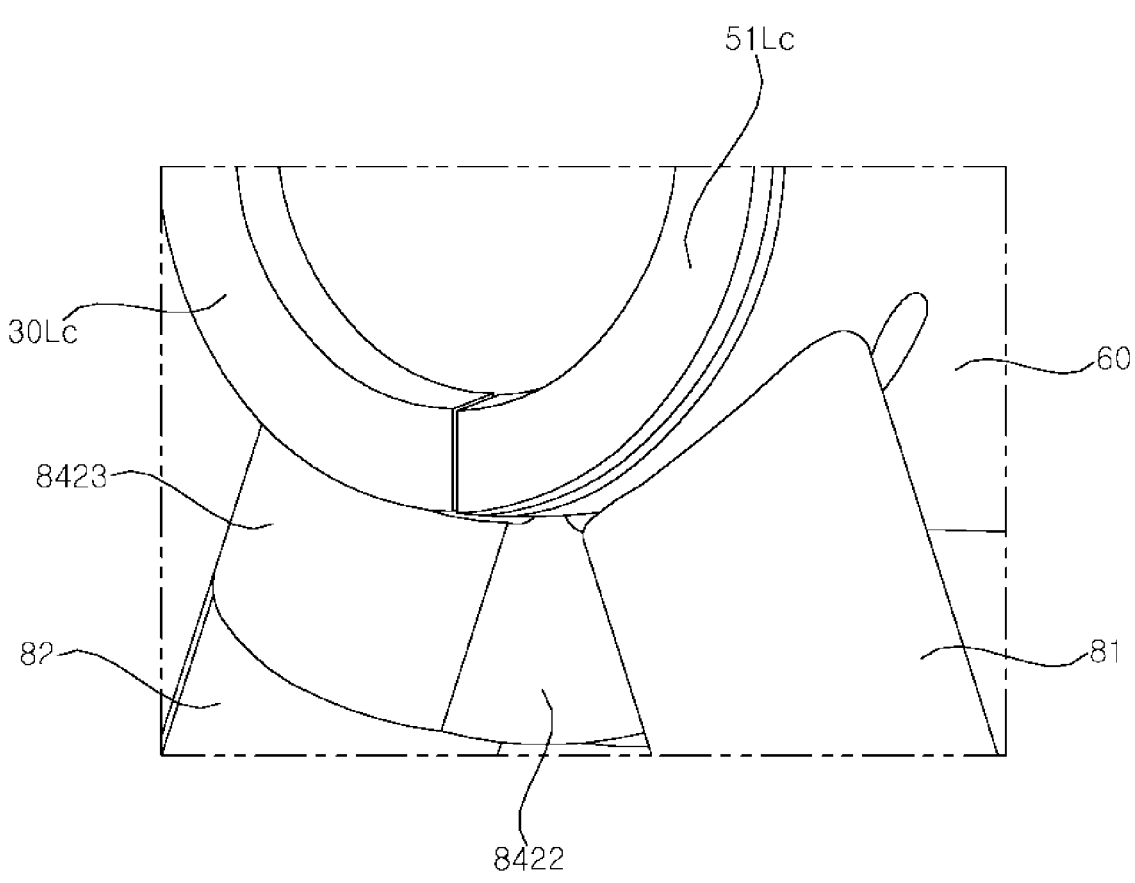

Referring to FIGS. 20 and 21, the third portion 8423 of the second supporter 842 may be accommodated in the groove 811. The lower surface 8413*d* of the third portion 8423 may contact the bottom portion 8111 of the groove 811. The upper surface 8423*c* of the third portion 8423 may be located in a lower position than the upper surface of the first leg 81. When the stand 80 supports the head, the upper surface 8423*c* of the third portion 8423 may face the lower side of the head. The upper surface of the first leg 81 may be formed as a curved surface having a curvature corresponding to the curvature of the third area of the head. The depth H2 of the groove 811 may be greater than the height H1 of the third portion 8423. The lowest depth H2 of the groove 811 may be greater than the height H1 of the third portion 8423. The third portion 8423 may be accommodated in the groove 811 and may not be exposed to the outside. The head of the fastening member may be located in a space between the upper surface 8423*c* of the third portion 8423 and the upper surface of the first leg 81.

The neck 84 may be formed of a metal material. The reinforcing plate 83 may be formed of a metal material. The leg 81, 82 may be formed of a metal material. The reinforcing plate 83 may be formed of a metal material different from that of the neck 84. The reinforcing plate 83 may be formed of a metal material different from that of the leg 81, 82. For example, the neck 83 and the leg 81, 82 may be formed of aluminum. The neck 83 and the leg 81, 82 may be formed of an alloy including aluminum. The reinforcing plate may be formed of hot rolled galvanized iron (HGI). The neck 83 may be made of aluminum di-casting (ALDC). The neck 83 may have a property of being broken by an external impact. The leg 81, 82 may be manufactured through extrusion. The leg 81, 82 may have a property of being bent by an external impact. The rigidity of the reinforcing plate 83 may be greater than that of the neck 84. The rigidity of the reinforcing plate 83 may be greater than that of the leg 81, 82.

Figure 22:
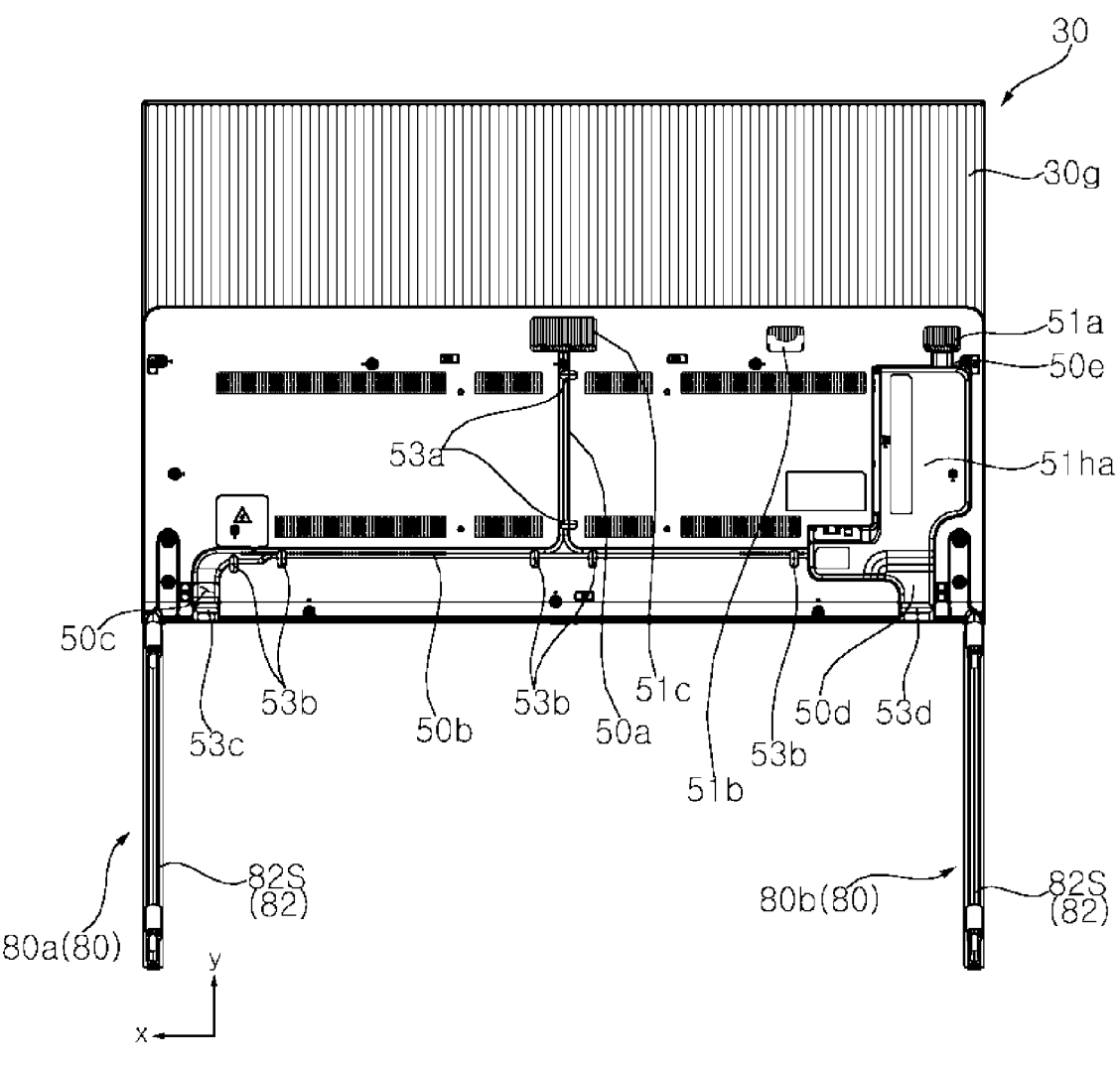
Figure 23:
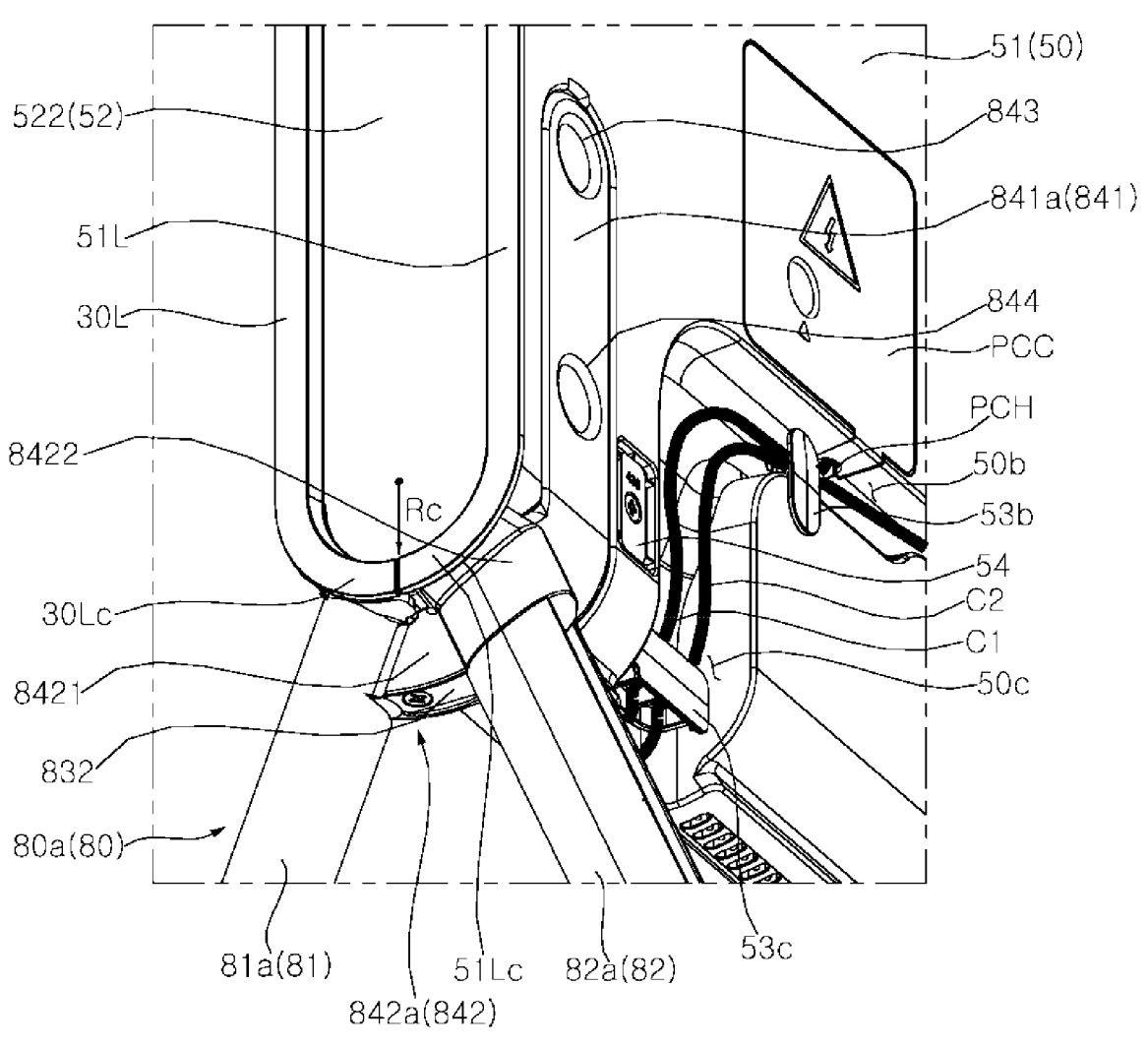

Referring to FIGS. 22 and 23, a plurality of cables may be located in a plurality of grooves 50*a*, 50*b*, 50*c*, 50*d*, and 50*e*. A plurality of holders 53*a*, 53*b*, 53*c*, and 53*d* may prevent the cables located in the plurality of grooves 50*a*, 50*b*, 50*c*, 50*d*, and 50*e* from being detached.

For example, the first cable C1 may be connected to the power supply board B1 (refer to FIG. 8) through a hole PCH formed in the cover PCC of the cover hole 51*h*2 (refer to FIG. 14). The first cable C1 may be located in the second groove 50*b* and the third groove 50*c*, and may be fixed to a first path of the third holder 53*c*. The first cable C1 may be located in the cable groove 82S formed on the rear side of the second leg 82 of the first stand 80*a*. The first cable C1 may be a power cable.

For example, the second cable C2 may be connected to a terminal provided in the right side of the main board B3 (refer to FIG. 8) through the opening 51*h*1 (refer to FIG. 12).

The second cable C2 may be located in the recessed portion 51*ha* and the fifth groove 50*e*. The second cable C2 may pass between the rear cover 51 and the frame 30 through the first cut-out 521Va (refer to FIGS. 10 and 13). The second cable C2 may be located in the first groove 50*a*, the second groove 50*b*, and the third groove 50*c* through the second cut-out 521Vb (refer to FIGS. 10 and 13), and may be fixed to a second path of the third holder 53*c*. The second cable C2 may be located in the cable groove 82S formed on the rear side of the second leg 82 of the first stand 80*a*. The second cable C2 may be an AV cable.

For example, the third cable C3 may be connected to a terminal provided on the lower side of the main board B3 (refer to FIG. 8) through the opening 51*h*1 (refer to FIG. 12). The third cable C3 may be located in the recessed portion 51*ha* and the fourth groove 50*d*, and may be fixed to a path provided in the fourth holder 53*d*. The third cable C3 may be located in the cable groove 82S formed on the rear side of the second leg 82 of the second stand 80*b*. The third cable C3 may be an AV cable.

Figure 24:
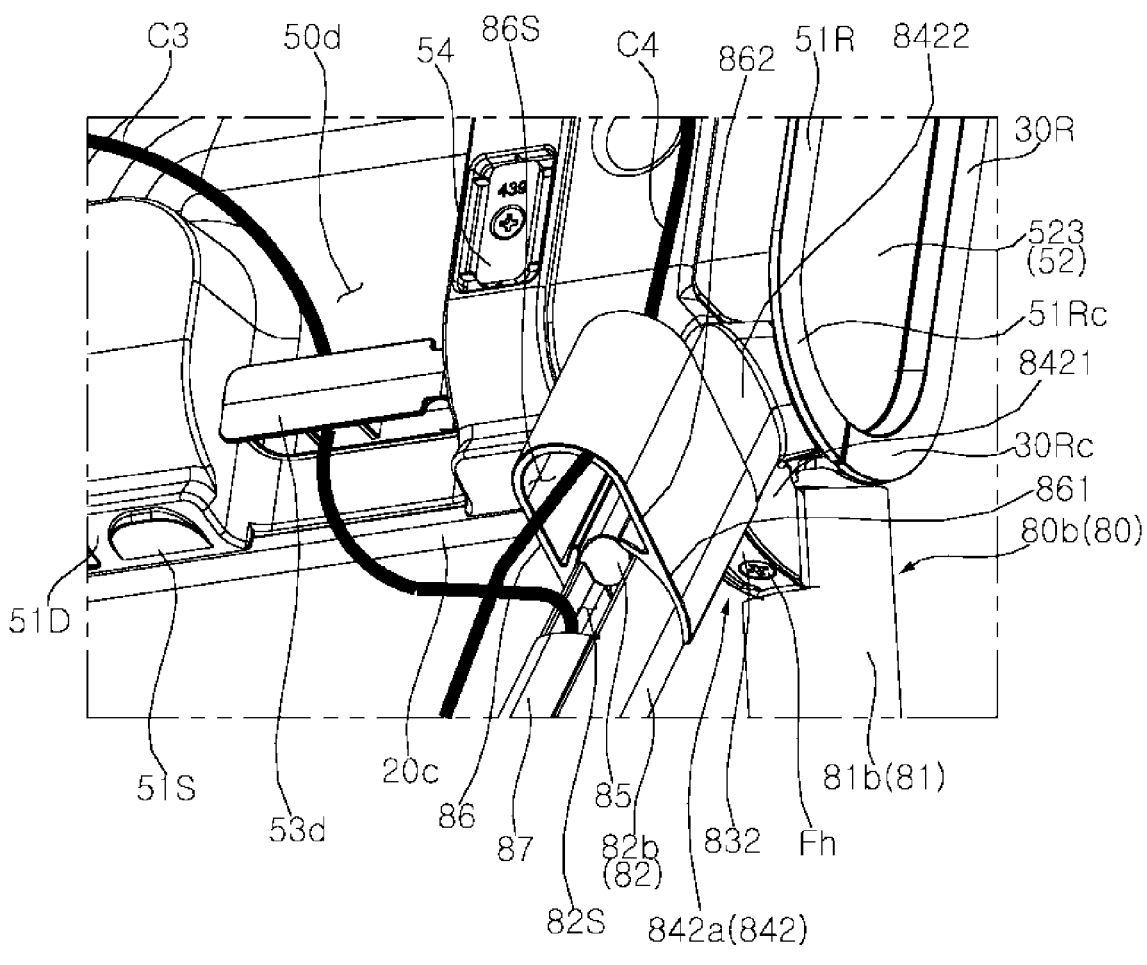
Figure 25:
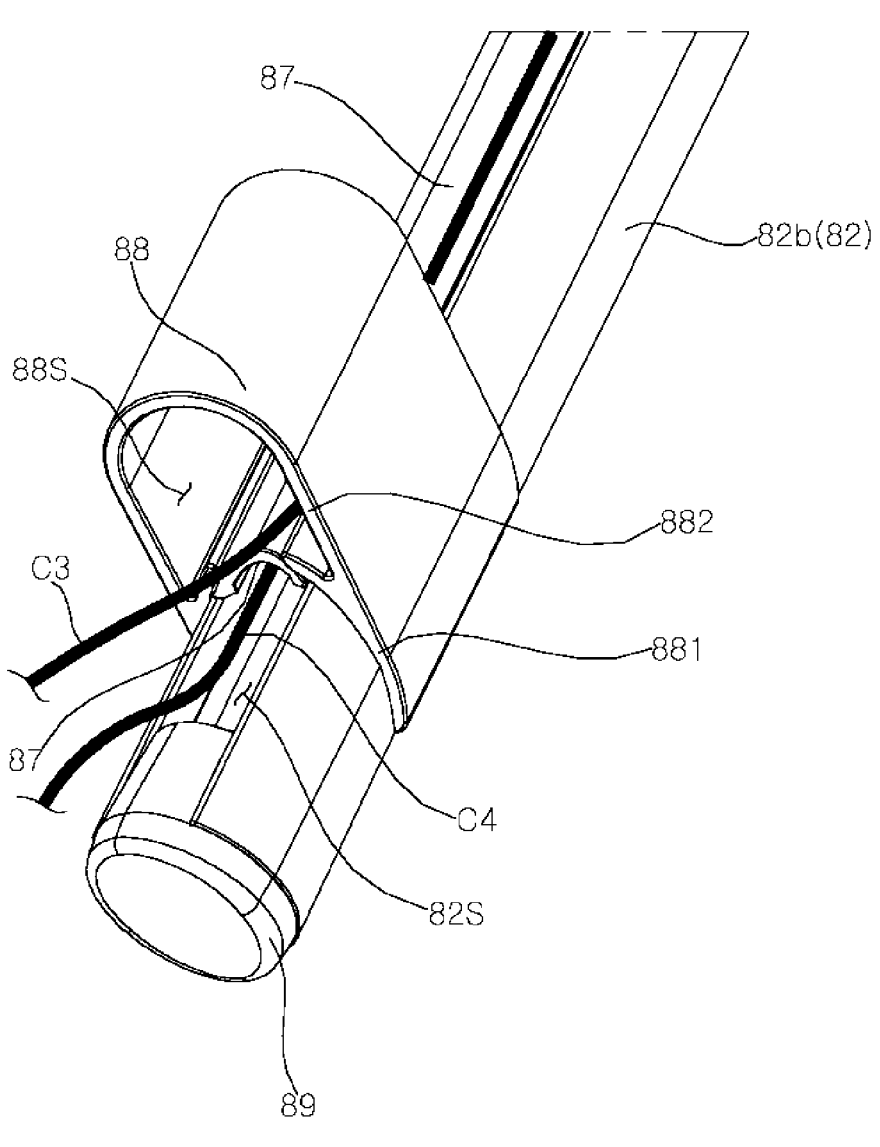

Referring to FIGS. 24 and 25, the cable groove 82S may be formed while being recessed forward from the rear side of the second leg 82, and may extend along the longitudinal direction of the second leg 82.

A cable cover 87 may be located between the upper end and the lower end of the second leg 82, and may cover the rearward of the cable groove 82S. The cable cover 87 may be detachably coupled to the second leg 82, for example, through a hook engagement. Accordingly, a cable such as the third cable C3 may be located in the cable groove 82S, and may be covered by the cable cover 87.

The supporter 85 may be located in the cable groove 82S, and may contact the rear side of the fourth portion 8424 (refer to FIG. 18) of the neck 84.

An upper holder 86 may be adjacent to the upper end of the second leg 82. The upper holder 86 may include a coupling portion 861 and a channel portion 862. The coupling portion 861 may have a shape corresponding to the outer surface of the second leg 82, and may hold the outer surface of the second leg 82. In this case, the supporter 85 may support the coupling of the second leg 82 and the coupling portion 861. The channel portion 862 may extend rearward from the coupling portion 861, and may have a "U" shaped cross-section.

Accordingly, the upper holder 86 may be detachably coupled to the second leg 82. For example, when the cable groove 82S is full of cables, other cable may pass through the channel 86S of the upper holder 86 defined by the channel portion 862. A lower holder 88 may be adjacent to the lower end of the second leg 82. The lower holder 88 may include a coupling portion 881 and a channel portion 882. The coupling portion 881 may have a shape corresponding to the outer surface of the second leg 82, and may hold the outer surface of the second leg 82. At this time, the cable cover 87 may support the coupling of the second leg 82 and the coupling portion 881. The channel portion 882 may extend rearward from the coupling portion 881, and may have a "U" shaped cross-section.

Accordingly, the lower holder 88 may be detachably coupled to the second leg 82. For example, if the cable groove 82S is full of cables, other cable may pass through the channel 88S of the lower holder 88 defined by the channel portion 882.

Meanwhile, a foot 89 may be coupled to the lower end of the second leg 82 and the lower end of the first leg 81. The foot 89 is a portion in contact with the ground, and may include a rubber or silicone material.

Figure 26:
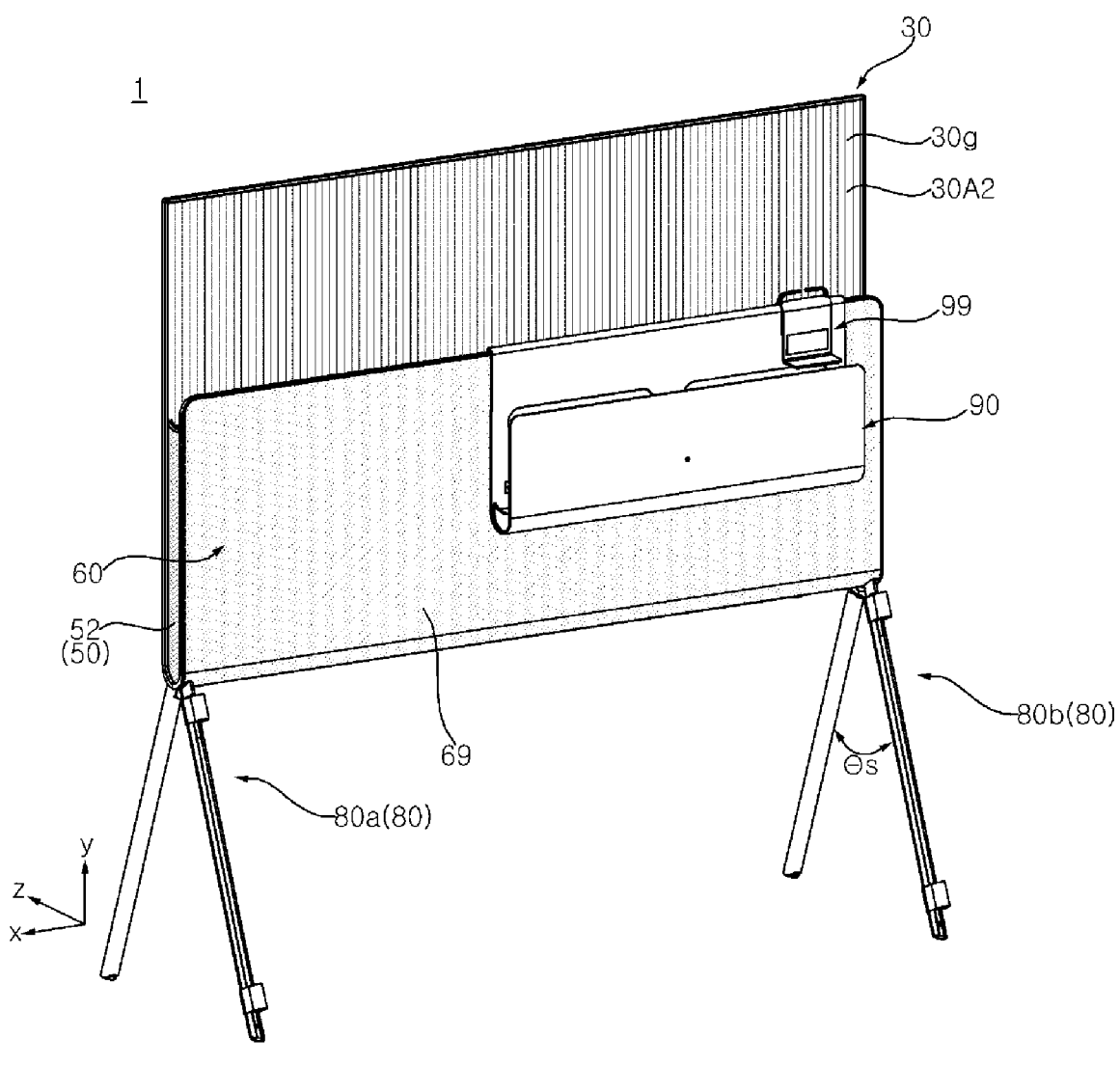
Figure 27:
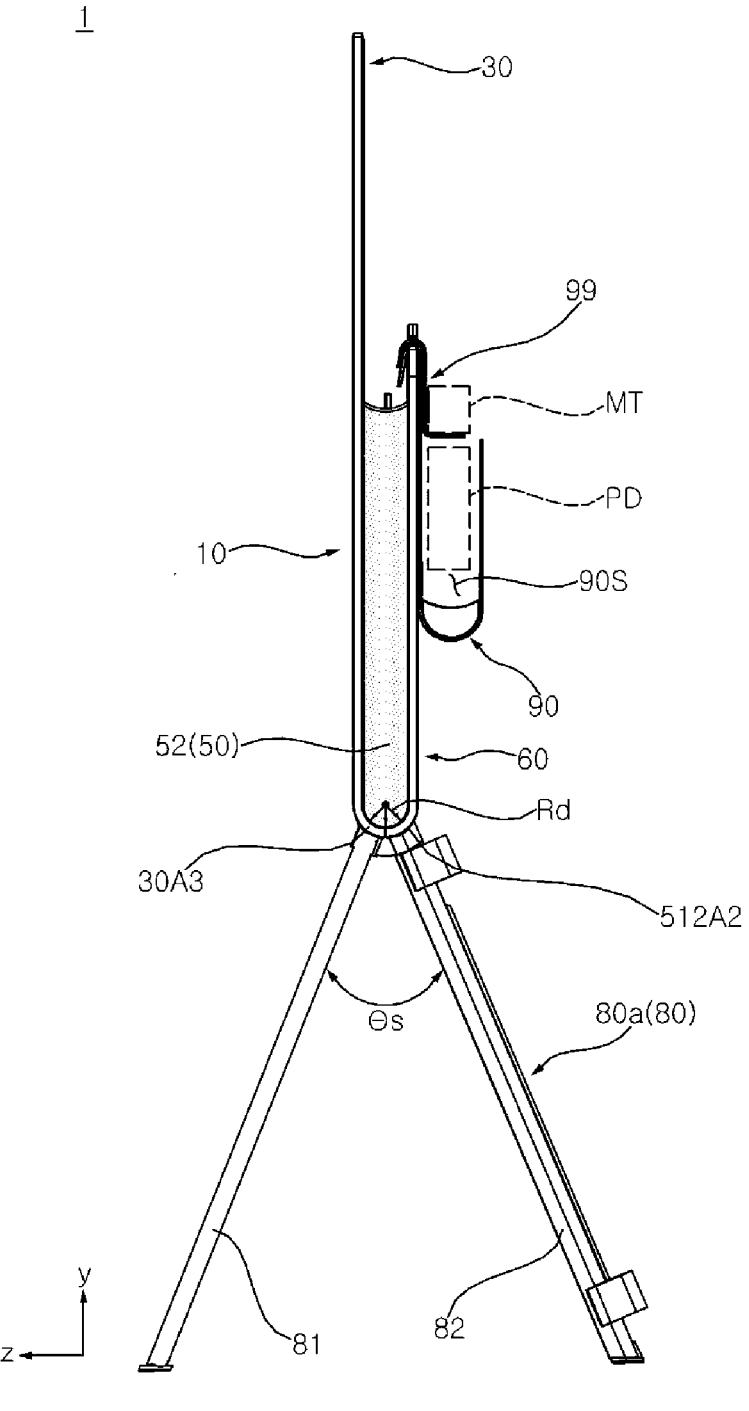

Referring to FIGS. 26 and 27, the basket 90 may have a "U" shape as a whole. The basket 90 may span the upper side of the end cover 60. The bracket 99 may have an "L" shape as a whole. The bracket 99 may span the upper side of the basket 90. For example, a user may put a peripheral device (PD) such as a set-top box or a router, or an object such as a book, into the inner space of the basket 90. Accordingly, things can be accommodated in the rearward of the display device.

Referring to FIGS. 1 to 27, a display device 1 according to an aspect of the present disclosure may include: a head having a display panel 10; and a stand 80 for supporting a lower side of the head, wherein the stand 80 may include: a neck 84 which is coupled on a rear side of the head, and a part of which is located below the lower side of the head; a leg 81, 82 which is opposite the head with respect to the part of the neck 84, and which extends downward from the head; and a reinforcing plate 83 coupled to the leg 81, 82, wherein the reinforcing plate 83 may include: a first part 831 coupled to the leg 81, 82; and a second part 832 which is bent toward the part of the neck 84 from the first part 831, and which is coupled to a lower surface of the part of the neck 84.

The leg 81, 82 may include a first leg 81 extending downward from the head, and a second leg 82 extending downward from the head while extending in a direction different from an extending direction of the first leg 81, wherein the part of the neck 84 may be located between an upper end of the first leg 81 and an upper end of the second leg 82, wherein the first part 831 of the reinforcing plate 83 may be coupled to any one of the first leg 81 and the second leg 82.

The leg may include a first leg 81 extending downward from the head while extending in a forward direction of the head, and a second leg 82 extending downward from the head while extending in a rearward direction of the head, wherein the first part 831 of the reinforcing plate 83 may be coupled to the second leg 82, wherein the reinforcing plate 83 may further include a third part 833 coupled to the first leg 81, wherein extending directions of the first to third parts 831, 832, 833 of the reinforcing plate 83 may be different from each other.

The second part 832 may extend in a direction perpendicular to an extending direction of the neck 84, wherein the first part 831 may be bent downward from one end portion of the second part 832, while being bent along an extending direction of the second leg 82, wherein the third part 833 may be bent upward from the other end portion of the second part 832, while being bent toward an upper surface of the first leg 81.

The first part 831 may have a first length L1 in an extending direction of the first part 831, wherein the third part 833 may have a second length L2 in an extending direction of the third part 833, wherein the first length L1 may be greater than the second length L2.

The first part 831 may be bent to form a first angle with respect to the second part 832, wherein the third part 833 may be bent to form a second angle with respect to the second part 832, wherein the second angle may be greater than the first angle.

The neck 84 may include: a first supporter 841 supporting the rear side of the head; and a second supporter 842 which supports the lower side of the head and which is coupled to the leg, as the part of the neck 84, wherein the second supporter 842 may include: a first portion 8421 that has a lower surface to which the second part 832 of the reinforcing plate 83 is coupled, and which supports a first area of the lower side of the head; and a second portion 8422 which is coupled to the leg, and which supports a second area located rearward than the first area of the lower side of the head, wherein the first part 831 of the reinforcing plate 83 may extend along the leg and is coupled to the leg and the second portion 8422 of the second supporter 842.

The second supporter 842 may include a third portion 8423 supporting a third area located in a forward of the first area on the lower side of the head, wherein the legs may include: a first leg 81 which extends downward from the head while extending to be inclined in a forward direction of the head, and which is coupled to the third portion 8423 of the second supporter 842; and a second leg 82 which extends downward from the head while extending to be inclined in a rearward direction of the head, and which is coupled to the second portion 8422 of the second supporter 842, wherein the reinforcing plate 83 may further include a third part 833 which extends forward from the second part 832, and which is coupled to a lower surface of the third portion 8423 of the second supporter 842 and the first leg 81.

The first leg 81 may include a groove 811 which is recessed in an extending direction of the first leg 81 from an upper surface of the first leg 81 facing the third area of the head, wherein the third portion 8423 of the second supporter 842 may be accommodated in the groove 811 of the first leg 81, and a depth of the groove 811 in the extending direction of the first leg 81 may be formed to be longer than a height in a corresponding direction of the third portion 8423 of the second supporter 842.

The groove 811 of the first leg 81 may include: a bottom portion 8111 in which the lower surface of the third portion 8423 of the second supporter 842 is disposed; a side portion 8112 extending upward from an outer edge area of the bottom portion 8111 along the extending direction of the first leg 81; and an opening portion 8113 which is formed as at least a part of the side portion 8112 includes is opened toward the first portion 8421 of the second supporter 842, wherein the third portion 8423 of the second supporter 842 may rest on the bottom portion 8111 of the groove 811, and a connection portion between the third portion 8423 of the second supporter 842 and the first portion 8421 of the second supporter 842 is located in the opening portion 8113.

The head may include: a frame 30 which is located in a rearward of the display panel 10, and which is coupled to the display panel 10; a back cover 50 which covers a rearward of the frame 30, and which is coupled to the frame 30; and an end cover 60 which covers a rearward of the back cover 50, and which is coupled to the back cover 50, wherein the neck 84 disposed on the rear side of the head is disposed between the back cover 50 and the end cover 60, and which is coupled to the back cover 50.

The back cover 50 may include a coupling groove 50GL, 50GR which is formed by pressing forward from a rear side of the back cover 50, and in which the neck 84 disposed on the rear side of the head is disposed, wherein the neck 84 disposed on the rear side of the head may include a neck 84 fixing portion which is formed by pressing toward the coupling groove 50GL, 50GR from the rear side of the neck 84, and into which a fastening member is inserted.

The neck 84 and the reinforcing plate 83 may be formed of a metal material, wherein a rigidity of metal material of the reinforcing plate 83 may be greater than a rigidity of metal material of the neck 84.

The effect of the display device according to the present disclosure will be described as follows.

According to at least one of the embodiments of the present disclosure, provided is a display device having a basket capable of accommodating peripheral devices in a rearward of a back cover.

According to at least one of the embodiments of the present disclosure, provided is a display device having a bracket capable of mounting a device such as a multi-tap.

According to at least one of the embodiments of the present disclosure, provided is a coupling structure between a back cover and a basket, and a coupling structure between the basket and a bracket.

According to at least one of the embodiments of the present disclosure, provided is a back cover in which a groove in which a cable is located is formed on a rear side.

According to at least one of the embodiments of the present disclosure, provided is a path of cable between a groove of back cover and a device provided in a basket or bracket.

According to at least one of the embodiments of the present disclosure, provided is a display device having a stand which separates a display panel from a ground and has a cable groove in which a cable is located.

According to at least one of the embodiments of the present disclosure, provided is a display device having a stand that has a reinforced rigidity to prevent a display device from rapidly being reversed, when an external impact acts on the display device.

Any or other embodiments of the present disclosure described above are not mutually exclusive or distinct. Any or other embodiments of the present disclosure described above may be used jointly or combined in each configuration or function.

For example, it means that configuration A described in a specific embodiment and/or drawings may be combined with configuration B described in other embodiments and/or drawings. That is, even if the coupling between the components is not directly described, it means that the coupling is possible except for the case where it is described that the coupling is impossible.

The above detailed description should not be construed as restrictive in all respects and should be considered as illustrative. The scope of the present disclosure should be determined by a reasonable interpretation of the appended claims, and all modifications within the equivalent scope of the present disclosure are included in the scope of the present disclosure.

What is claimed is:

1. A display device comprising:
a head having a display panel; and
a stand for supporting a lower side of the head,
wherein the stand comprises:
a neck disposed on a rear side of the head, wherein a portion of the neck is located below the lower side of the head;
a leg which is opposite the head with respect to the portion of the neck, and which extends downward from the head; and
a reinforcing plate coupled to the leg, and
wherein the reinforcing plate comprises:
a first portion coupled to the leg; and
a second portion which is bent toward the portion of the neck from the first portion, and which is coupled to a lower surface of the portion of the neck,
wherein the neck comprises:
a first supporter for supporting the rear side of the head; and a second supporter which is for supporting the lower side of the head and which is coupled to the leg,
wherein the second supporter comprises:
a first portion that has a lower surface to which the second portion of the reinforcing plate is coupled, and which supports a first area of the lower side of the head; and
a second portion which is coupled to the leg, and which supports a second area located behind the first area of the lower side of the head,
wherein the first portion of the reinforcing plate extends along the leg and is coupled to the leg and the second portion of the second supporter,
wherein the neck comprises a first metal material,
wherein the reinforcing plate comprises a second metal material, and
wherein a rigidity of the second metal material is greater than a rigidity of the first metal material.

2. The display device of claim 1, wherein the leg comprises a first leg extending downward from the head along a first direction, and a second leg extending downward from the head along a second direction different from the first direction,
wherein the portion of the neck is located between an upper end of the first leg and an upper end of the second leg, and
wherein the first portion of the reinforcing plate is coupled to one of the first leg or the second leg.

3. The display device of claim 1, wherein the leg comprises a first leg extending downward from the head along a forward direction of the head, and a second leg extending downward from the head along a rearward direction of the head,
wherein the first portion of the reinforcing plate is coupled to the second leg,
wherein the reinforcing plate further comprises a third portion coupled to the first leg, and
wherein the first portion, the second portion and the third portion of the reinforcing plate extend along respective directions that are different from each other.

4. The display device of claim 3, wherein the second portion of the reinforcing plate extends along a direction perpendicular to a direction along which the neck extends,
wherein the first portion of the reinforcing plate is bent downward from a first end of the second portion of the reinforcing plate, along the rearward direction of the head along which the second leg extends, and
wherein the third portion of the reinforcing plate is bent upward from a second end of the second portion of the reinforcing plate, toward an upper surface of the first leg.

5. The display device of claim 3, wherein the first portion of the reinforcing plate has a first length in a direction along which the first portion extends,
wherein the third portion of the reinforcing plate has a second length in a direction along which the third portion extends, and
wherein the first length is greater than the second length.

6. The display device of claim 3, wherein the first portion of the reinforcing plate is bent to form a first angle with respect to the second portion of the reinforcing plate,
wherein the third portion of the reinforcing plate is bent to form a second angle with respect to the second portion of the reinforcing plate, and
wherein the second angle is greater than the first angle.

7. The display device of claim 1, wherein the second supporter further comprises a third portion supporting a third area located in front of the first area of the lower side of the head, wherein the leg comprises:

a first leg which extends downward from the head to be inclined in a forward direction of the head, and which is coupled to the third portion of the second supporter; and a second leg which extends downward from the head to be inclined in a rearward direction of the head, and which is coupled to the second portion of the second supporter, and wherein the reinforcing plate further comprises a third portion which extends forward from the second portion of the reinforcing plate, and which is coupled to a lower surface of the third portion of the second supporter and the first leg.

8. The display device of claim 7, wherein the first leg has a groove which is recessed in a direction along which the first leg extends from an upper surface of the first leg facing the third area of the head, wherein the third portion of the second supporter is accommodated in the groove of the first leg, and wherein a depth of the groove in the direction along which the first leg extends is greater than a height of the third portion of the second supporter in a corresponding direction.

9. The display device of claim 8, wherein the groove of the first leg has:

a bottom portion in which the lower surface of the third portion of the second supporter is disposed;

a side portion extending upward from an outer edge area of the bottom portion along the direction along which the first leg extends; and an opening portion formed at least partially by the side portion that opens toward the first portion of the second supporter, wherein the third portion of the second supporter rests on the bottom portion of the groove, and wherein a connection portion between the third portion of the second supporter and the first portion of the second supporter is located in the opening portion of the groove.

10. The display device of claim 1, wherein the head comprises:

a frame which is located behind the display panel, and which is coupled to the display panel;

a back cover which covers a rear of the frame, and which is coupled to the frame; and an end cover which covers a rear of the back cover, and which is coupled to the back cover, and wherein the neck is disposed between the back cover and the end cover, and is coupled to the back cover.

11. The display device of claim 10, wherein the back cover has a coupling groove corresponding to a pressing forward from a rear side of the back cover, and in which the neck is disposed, and wherein the neck comprises a neck fixing portion corresponding to a pressing toward the coupling groove from a rear side of the neck, and into which a fastening member is inserted.

12. A display device comprising:

a head having a display panel; and a stand for supporting a lower side of the head, wherein the stand comprises:

a neck disposed on a rear side of the head, wherein a portion of the neck is located below the lower side of the head;

a leg which is opposite the head with respect to the portion of the neck, and which extends downward from the head; and a reinforcing plate coupled to the leg, wherein the reinforcing plate comprises:

a first portion coupled to the leg; and a second portion which is bent toward the portion of the neck from the first portion, and which is coupled to a lower surface of the portion of the neck, wherein the leg comprises a first leg extending downward from the head along a forward direction of the head, and a second leg extending downward from the head along a rearward direction of the head, wherein the first portion of the reinforcing plate is coupled to the second leg, wherein the reinforcing plate further comprises a third portion coupled to the first leg, wherein the first portion, the second portion and the third portion of the reinforcing plate extend along respective directions that are different from each other, wherein the first portion of the reinforcing plate has a first length in a direction along which the first portion extends, wherein the third portion of the reinforcing plate has a second length in a direction along which the third portion extends, and wherein the first length is greater than the second length.

13. A display device comprising:

a head having a display panel; and a stand for supporting a lower side of the head, wherein the stand comprises:

a neck disposed on a rear side of the head, wherein a portion of the neck is located below the lower side of the head;

a leg which is opposite the head with respect to the portion of the neck, and which extends downward from the head; and a reinforcing plate coupled to the leg, and wherein the reinforcing plate comprises:

a first portion coupled to the leg; and a second portion which is bent toward the portion of the neck from the first portion, and which is coupled to a lower surface of the portion of the neck, wherein the neck comprises a first metal material, wherein the reinforcing plate comprises a second metal material, and wherein a rigidity of the second metal material is greater than a rigidity of the first metal material.

\* \* \* \* \*